United States Patent
Kamikawa

(10) Patent No.: US 9,857,059 B2
(45) Date of Patent: Jan. 2, 2018

(54) LIGHT EMITTING DEVICE, ILLUMINATING DEVICE AND METHOD OF MANUFACTURING LIGHT EMITTING DEVICE

(75) Inventor: Takeshi Kamikawa, Osaka (JP)

(73) Assignee: Sharp Kabushiki Kaisha, Osaka-Shi, Osaka (JP)

(*) Notice: Subject to any disclaimer, the term of this patent is extended or adjusted under 35 U.S.C. 154(b) by 58 days.

(21) Appl. No.: 14/353,741

(22) PCT Filed: Sep. 14, 2012

(86) PCT No.: PCT/JP2012/073625
§ 371 (c)(1),
(2), (4) Date: Apr. 23, 2014

(87) PCT Pub. No.: WO2013/065414
PCT Pub. Date: May 10, 2013

(65) Prior Publication Data
US 2015/0029725 A1     Jan. 29, 2015

(30) Foreign Application Priority Data

Oct. 31, 2011 (JP) .................................. 2011-238883

(51) Int. Cl.
*F21V 7/00* (2006.01)
*F21V 13/08* (2006.01)
(Continued)

(52) U.S. Cl.
CPC ............... *F21V 13/08* (2013.01); *F21K 9/90* (2013.01); *F21V 7/0066* (2013.01); *F21V 7/22* (2013.01);
(Continued)

(58) Field of Classification Search
CPC ..................................................... H01L 51/56
See application file for complete search history.

(56) References Cited

U.S. PATENT DOCUMENTS

| | | | | |
|---|---|---|---|---|
| 6,396,082 B1* | 5/2002 | Fukasawa | ............. | H01L 33/486 257/100 |
| 2007/0001315 A1* | 1/2007 | Yokoyama | ........ | H01L 23/49866 257/779 |

(Continued)

FOREIGN PATENT DOCUMENTS

| | | |
|---|---|---|
| CN | 1463047 | 12/2003 |
| CN | 101272997 | 9/2008 |

(Continued)

OTHER PUBLICATIONS

English Translation of CN102208392.*
Internation Search Report dated Oct. 9, 2012, directed to International Application No. PCT/JP2012/073625, 4 pgs.

*Primary Examiner* — Evan Dzierzynski
(74) *Attorney, Agent, or Firm* — Morrison & Foerster LLP

(57) ABSTRACT

A light emitting device includes a light emitting element, a ceramic substrate including a mounting surface on which the light emitting element is mounted, and a non-mounting surface opposite to the mounting surface and on which the light emitting element is not mounted, and a metal reflection film formed on the non-mounting surface. The metal reflection film reflects light from light emitting element that has passed through the ceramic substrate.

10 Claims, 29 Drawing Sheets

(51) Int. Cl.
  *H01L 33/60* (2010.01)
  *F21K 9/90* (2016.01)
  *F21V 7/22* (2006.01)
  *H01L 25/075* (2006.01)
  *H01L 23/00* (2006.01)
  *F21Y 115/10* (2016.01)

(52) U.S. Cl.
  CPC ........... *H01L 33/60* (2013.01); *F21Y 2115/10* (2016.08); *H01L 24/45* (2013.01); *H01L 25/0753* (2013.01); *H01L 2224/45124* (2013.01); *H01L 2224/45144* (2013.01); *H01L 2224/45147* (2013.01); *H01L 2224/45169* (2013.01); *H01L 2224/48091* (2013.01); *H01L 2224/48137* (2013.01); *H01L 2924/01015* (2013.01); *H01L 2924/01047* (2013.01); *H01L 2924/181* (2013.01); *H01L 2933/0091* (2013.01); *Y10T 29/4913* (2015.01)

(56) References Cited

U.S. PATENT DOCUMENTS

| | | | |
|---|---|---|---|
| 2007/0139949 A1* | 6/2007 | Tanda | F21K 9/135 362/551 |
| 2007/0194346 A1 | 8/2007 | Nagase et al. | |
| 2007/0252523 A1* | 11/2007 | Maeda | C04B 41/009 313/506 |
| 2008/0224608 A1 | 9/2008 | Konishi et al. | |
| 2008/0269040 A1 | 10/2008 | Sugawara et al. | |
| 2010/0025722 A1 | 2/2010 | Wada | |
| 2010/0090239 A1* | 4/2010 | Lin | H01L 33/486 257/98 |
| 2010/0314642 A1 | 12/2010 | Kudo et al. | |
| 2011/0114969 A1 | 5/2011 | Lee et al. | |
| 2011/0186336 A1* | 8/2011 | Nakayama | B24C 3/322 174/255 |
| 2011/0227111 A1 | 9/2011 | Choi et al. | |
| 2012/0248469 A1* | 10/2012 | Choi | H01L 25/0753 257/88 |
| 2013/0077313 A1* | 3/2013 | Chen | F21V 3/04 362/249.02 |

FOREIGN PATENT DOCUMENTS

| | | |
|---|---|---|
| CN | 102074622 | 5/2011 |
| CN | 102194947 | 9/2011 |
| CN | 102208392 | 10/2011 |
| JP | 2007-227412 A | 9/2007 |
| JP | 2008-227412 A | 9/2008 |
| JP | 2009-206200 A | 9/2009 |
| JP | 2009-290244 | 12/2009 |
| JP | 2011-222674 A | 11/2011 |
| JP | 2012-089551 A | 5/2012 |
| WO | WO 2008/047923 A1 | 4/2008 |
| WO | WO 2008/059650 A1 | 5/2008 |

* cited by examiner

Fig. 6
Fig. 6(a)
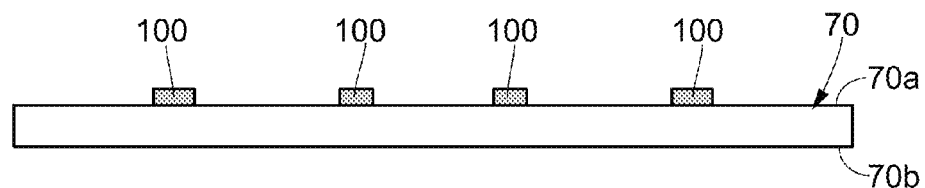
Fig. 6(b)
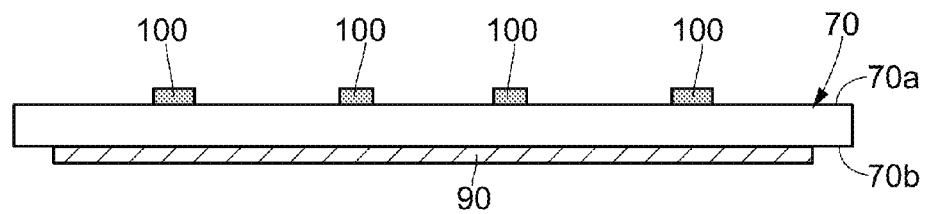
Fig. 6(c)
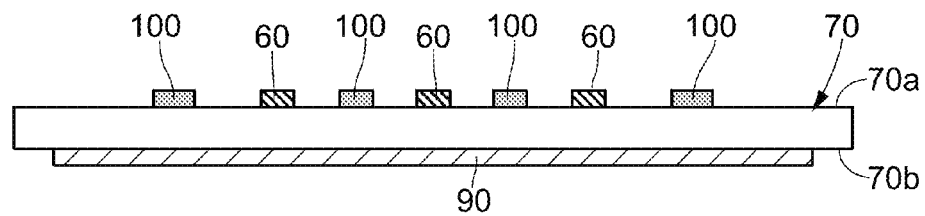
Fig. 6(d)
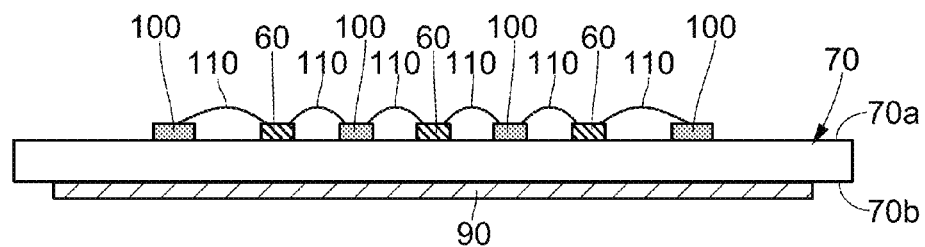
Fig. 6(e)
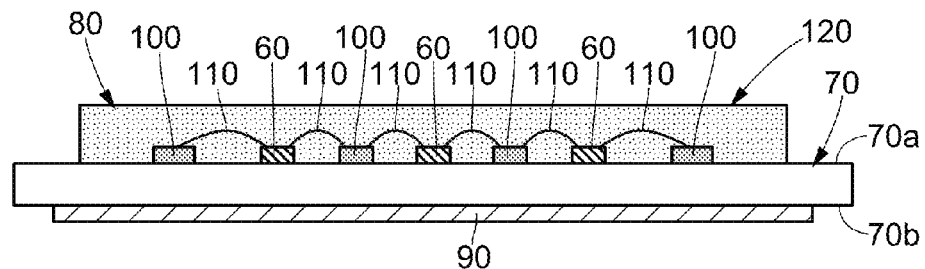

Fig. 21
Fig. 21(a)
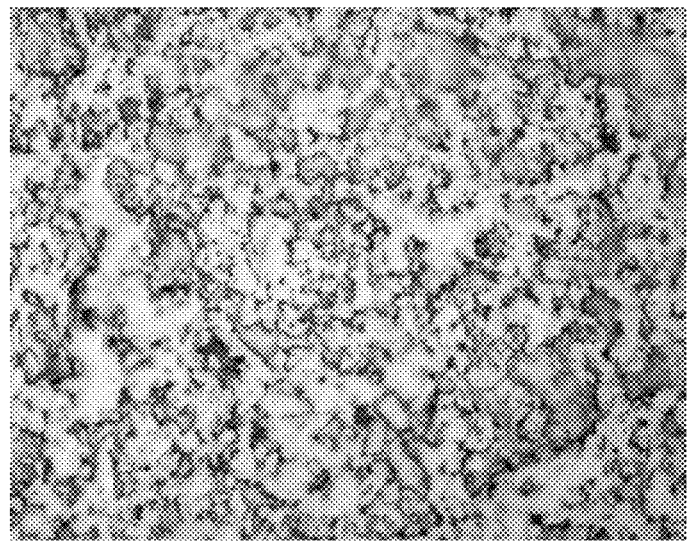
(Ra OF NON-MOUNTING SURFACE OF CERAMIC SUBSTRATE: 0.16 μm)
Fig. 21(b)
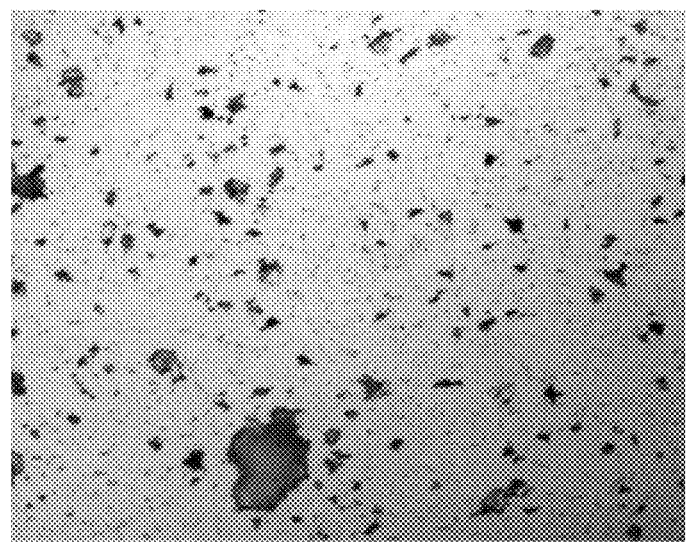
(Ra OF NON-MOUNTING SURFACE OF CERAMIC SUBSTRATE: 0.02 μm)

LIGHT EMITTING DEVICE, ILLUMINATING DEVICE AND METHOD OF MANUFACTURING LIGHT EMITTING DEVICE

CROSS-REFERENCE TO RELATED APPLICATIONS

This application is a national stage application under 35 USC 371 of International Application No. PCT/JP2012/073625, filed on Sep. 14, 2012, which claims priority to Japanese Patent Application No. 2011-238883, filed on Oct. 31, 2011, the entire contents of which are hereby incorporated by reference.

FIELD OF THE INVENTION

The present invention relates to a light emitting device, an illuminating device and a method of manufacturing a light emitting device and, more specifically, to a light emitting device using a ceramic substrate, an illuminating device using the light emitting device and to a method of manufacturing the light emitting device.

BACKGROUND OF THE INVENTION

Recently, LEDs (Light Emitting Diodes) have come to be widely used as light sources of illuminating devices. White light of an illuminating device using LEDs can be realized by a method of using LEDs of three different colors, that is, red, blue and green LEDs, or a method of using fluorescent substance that converts excited light emitted from blue LED to yellow light. Since white light of sufficient intensity is required of a light source for illumination, illuminating devices using a plurality of LED chips have been introduced to the market.

Patent Literature 1 mentioned below discloses, as an example of such illuminating device, a light emitting device in which a plurality of LED chips are mounted on a ceramic substrate. In the light emitting device, each LED chip is electrically connected to a line pattern for interconnection formed on the ceramic substrate through a bonding wire. The plurality of LED chips mounted on the ceramic substrate is sealed by a sealing body containing a fluorescent substance.

PATENT LITERATURE

PTL 1: Japanese Patent Laying-Open No. 2009-290244

SUMMARY OF THE INVENTION

When a ceramic substrate is used as the substrate for mounting the LED chips as in the light emitting device of Patent Literature 1, a problem of heat radiation arises, since the ceramic substrate has lower heat conduction than a metal substrate. In order to efficiently dissipate heat, thickness of ceramic substrate must be reduced. This, in turn, causes a new problem that optical reflectance of the substrate decreases, since reflection of ceramic substrate utilizes diffused reflection. When the ceramic substrate is made thin, it follows that the light passes through the substrate and the reflectance decreases. In order to prevent decrease in reflectance, the thickness must be increased. If the substrate is made thick, however, heat radiation decreases, as described above. Thus, there is a trade-off between the heat radiation and reflectance in the conventional light emitting device using a ceramic substrate, and hence, it has been difficult to improve heat radiation while not decreasing the reflectance.

The present invention was made to solve the above-described problem, and an object of the present invention is to provide a light emitting device capable of improving both the reflectance and the heat radiation, an illuminating device mounting such a light emitting device, and a method of manufacturing the light emitting device.

In order to attain the above-described object, according to a first aspect, the present invention provides a light emitting device, including: a light emitting element; a ceramic substrate having a mounting surface on which the light emitting element is mounted and a non-mounting surface opposite to the mounting surface and on which the light emitting element is not mounted; and a metal reflection film, formed on the non-mounting surface, for reflecting light from the light emitting element transmitted through the ceramic substrate.

According to the first aspect, since a metal reflection film is formed on the non-mounting surface of ceramic substrate, the light from light emitting device that has passed through the ceramic substrate can be reflected by the metal reflection film. When the ceramic substrate is made thinner to improve heat radiation, the light from light emitting device is transmitted through the ceramic substrate, while the transmitted light is reflected by the metal reflection film. Therefore, even when the thickness of ceramic substrate is reduced, the reflectance can be improved. Further, as the ceramic substrate is made thin, the effect of improved heat radiation can also be attained. Therefore, by the structure described above, the reflectance of ceramic substrate can be improved while attaining higher heat radiation.

Preferably, surface roughness in maximum height (Rz) of the non-mounting surface of ceramic substrate is not larger than wavelength of light emitted from the light emitting element. Thus, scattering of light at the interface between the non-mounting surface and the metal reflection film can be reduced and the reflectance can effectively be improved.

More preferably, arithmetic mean surface roughness (Ra) of the non-mounting surface of ceramic substrate is at most 0.04 μm. Thus, scattering of light at the interface between the non-mounting surface and the metal reflection film can easily be reduced and the reflectance can more effectively be improved.

More preferably, thickness of the ceramic substrate is at least 0.2 mm and at most 2.0 mm. With the thickness of ceramic substrate being in this range, the effect of improved heat radiation and the effect of improved reflectance by the metal reflection film can effectively be attained. Further, the problem that the ceramic substrate becomes fragile if it is made too thin can be prevented.

More preferably, the metal reflection film includes any of a reflection film of Ag, a reflection film of Ag alloy, a reflection film of Al, and a reflection film of Al alloy. With such a structure, it is possible to effectively reflect the light that has passed through the ceramic substrate by the metal reflection film. As a result, the light extraction efficiency can effectively be improved.

More preferably, a region for forming the metal reflection film includes a region immediately below the light emitting element. Therefore, the light from light emitting device come to be more easily incident on the metal reflection film. Thus, it is possible to more effectively reflect the light that has passed through the ceramic substrate by the metal reflection film.

More preferably, the ceramic substrate includes a substrate formed of an alumina (aluminum oxide) sintered body.

The substrate formed of alumina sintered body has high reflectance and, therefore, such a structure further improves reflectance.

More preferably, the light emitting device further includes a sealing body formed on the mounting surface of ceramic substrate and containing a fluorescent substance excited by light from the light emitting element, for sealing the light emitting element. The light from light emitting element excites the fluorescent substance contained in the sealing body and part of the light emitted from the excited fluorescent substance enters the ceramic substrate. The light from the fluorescent substance entering the ceramic substrate passes through the ceramic substrate and reflected by the metal reflection film. Therefore, such a structure also realizes improved reflectance. The "light from light emitting element" mentioned above includes the light emitted from the fluorescent substance.

According to a second aspect, the present invention provides a light emitting device, including: a light emitting element; a ceramic substrate having a mounting surface on which the light emitting element is mounted and a non-mounting surface opposite to the mounting surface and on which the light emitting element is not mounted; and a metal reflection film, formed on the non-mounting surface, for reflecting light from the light emitting element transmitted through the ceramic substrate. In the light emitting device, surface roughness of the mounting surface of the ceramic substrate is larger than surface roughness of the non-mounting surface.

According to the second aspect, by increasing the surface roughness of mounting surface of the ceramic substrate to be larger than the surface roughness of non-mounting surface as described above, it becomes possible to improve the efficiency of extracting light reflected by the metal reflection film to the outside. Therefore, it is possible to increase heat radiation characteristic and to further improve the reflectance of ceramic substrate.

Preferably, arithmetic mean surface roughness (Ra) of the mounting surface of ceramic substrate is larger than 0.04 µm. Thus, the efficiency of extracting light reflected by the metal reflection film to the outside can further be improved.

More preferably, arithmetic mean surface roughness (Ra) of the non-mounting surface of the ceramic substrate is not larger than 0.04 µm. Thus, it is possible to easily prevent scattering of light at the interface between the non-mounting surface and the metal reflection film and thereby to effectively improve reflectance.

According to a third aspect, the present invention provides an illuminating device mounting the illuminating device according to the first or second aspect described above. By such a structure, an illuminating device having improved heat radiation and high illuminance can easily be obtained.

According to a fourth aspect, the present invention provides a method of manufacturing a light emitting device having a light emitting element mounted on a ceramic substrate, including the steps of: forming a metal reflection film on one surface of the ceramic substrate, for reflecting light emitted from the light emitting element and transmitted through the ceramic substrate; and mounting the light emitting element on the other surface of the ceramic substrate.

According to the fourth aspect, by forming the metal reflection film on the surface (opposite to the surface on which the light emitting element is mounted) of the ceramic substrate, the light from light emitting element that has passed through the ceramic substrate can be reflected by the metal reflection film. Therefore, when the ceramic substrate is made thin to improve heat radiation, reflectance can be improved. Therefore, by the manufacturing method described above, a light emitting device having higher heat radiation characteristic and at the same time improved reflectance of the ceramic substrate can easily be manufactured.

Preferably, the method further includes, before the step of forming the metal reflection film, a step of polishing the one surface of ceramic substrate, to have arithmetic mean surface roughness (Ra) of the one surface of ceramic substrate to 0.04 µm or smaller. Thus, scattering of light can be prevented at the interface between the metal reflection film and the ceramic substrate. Hence, a light emitting device having the reflectance of ceramic substrate effectively improved can easily be manufactured.

As described above, by the present invention, a light emitting device capable of improving both the reflectance and the heat radiation, an illuminating device mounting such a light emitting device, and a method of manufacturing the light emitting device can easily be provided.

BRIEF DESCRIPTION OF THE DRAWINGS

FIG. 6 is a cross-sectional view illustrating a method of manufacturing the light emitting device in accordance with the first embodiment of the present invention.

FIG. 21 is an optical microscope photograph of the surface of metal reflection film.

DETAILED DESCRIPTION OF THE INVENTION

Figure 1:
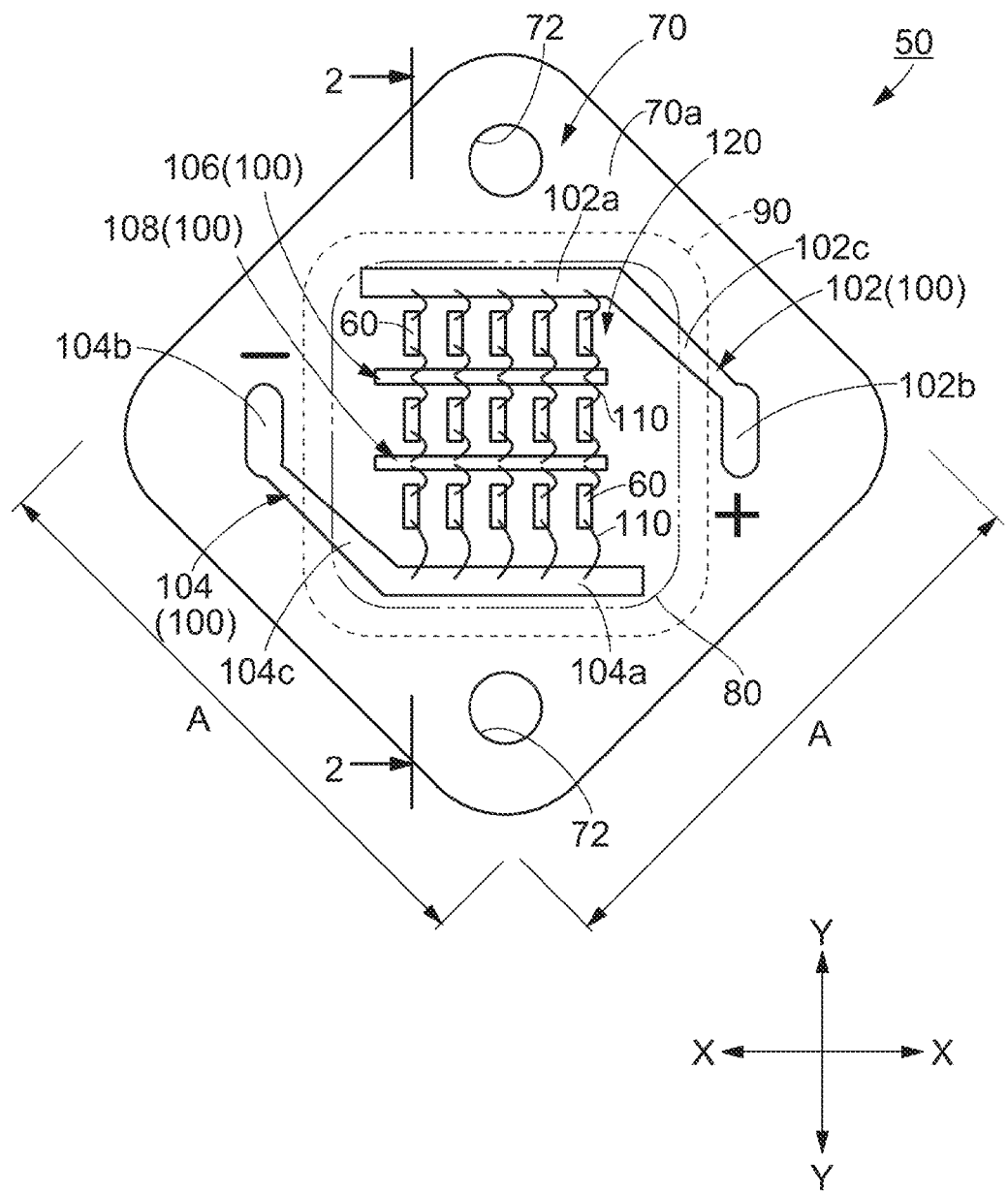
FIG. 1 is a plan view showing a light emitting device in accordance with a first embodiment of the present invention (with a sealing body omitted).

In the following, embodiments of the present invention will be described with reference to the figures. In the following description and in the drawings, the same components or parts are denoted by the same reference characters and same names. Their functions are also the same. Therefore, detailed description thereof will not be repeated.

Figure 2:
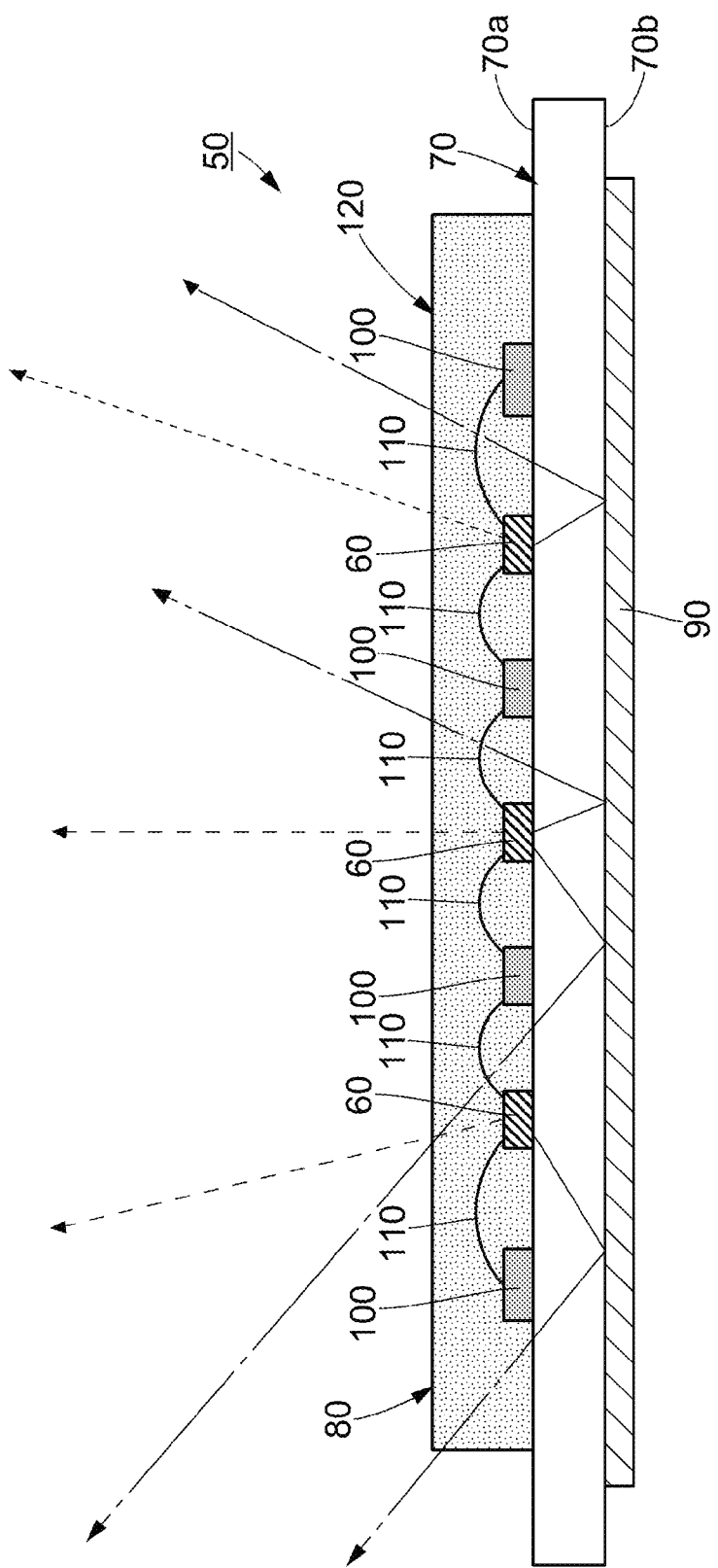
FIG. 2 is a cross-sectional view schematically showing a cross-section along a line 2-2 of FIG. 1.

Referring to FIGS. 1 and 2, a light emitting device 50 in accordance with the present embodiment includes a light emitting element 60 as a light source, a ceramic substrate 70 mounting light emitting element 60, a sealing body 80 formed on that surface of ceramic substrate 70 on which light emitting element 60 is mounted, for sealing light emitting element 60, and a metal reflection film 90 formed on the back side surface (opposite to the surface on which light emitting element 60 is formed) of ceramic substrate 70.

Light emitting element 60 is formed of a blue LED chip that emits blue light (wavelength: approximately 450 nm). The blue LED chip is formed by stacking gallium nitride compound semiconductor layer including an active layer on a transparent sapphire substrate (all not shown). In the present embodiment, a plurality of light emitting elements 60 as above are mounted on ceramic substrate 70.

Ceramic substrate 70 is an insulating substrate formed of white ceramic, and it has a mounting surface 70a on which light emitting element 60 is mounted, and a non-mounting surface 70b opposite to the mounting surface 70a, on which light emitting element is not mounted. Specifically, in light emitting device 50 in accordance with the present embodiment, light emitting element 60 is mounted on one of the front and back surfaces of ceramic substrate 70. White ceramic substrate 70 has small thermal expansion, high thermal conductivity and high light reflectance and, therefore, it is suitable as a substrate for mounting light emitting element 60. Ceramic substrate 70 is formed, for example, of high-temperature fired ceramic or low-temperature co-fired ceramic. A substrate formed of an alumina sintered body is suitable for ceramic substrate 70 as such.

Ceramic substrate 70 is formed to have a substantially square planar shape. Length A of one side of ceramic substrate 70 formed to have the substantially square shape is, by way of example, about 2 cm. Since ceramic substrate 70 as such is used, light emitting device 50 itself comes to have a substantially square planar shape.

On mounting surface 70a of ceramic substrate 70, an interconnection line pattern 100 is formed for electric connection to light emitting element 60 to be mounted thereon. Electric connection between light emitting element 60 and line pattern 100 is realized through a bonding wire 110. Line pattern 100 is formed, for example, of a gold film having the thickness of about 0.07 mm. Line pattern 100 also includes an anode line pattern 102 and a cathode line pattern 104. In the present embodiment, line pattern 100 includes, in addition to anode and cathode line patterns 102 and 104, a plurality of line patterns (line patterns 106 and 108).

Anode line pattern 102 includes a linear connecting portion 102a to which bonding wire 110 is connected, a land portion 102b for external connection, and a coupling portion 102c coupling connecting portion 102a and land portion 102b. Cathode line pattern 104 includes a linear connecting portion 104a to which bonding wire 110 is connected, a land portion 104b for external connection, and a coupling portion 104c coupling connecting portion 104a and land portion 104b. Line patterns 106 and 108 are each formed as a linear connecting portion to which bonding wire 110 is connected.

Land portion 102b of anode line pattern 102 and land portion 104b of cathode line pattern 104 are arranged at diagonal corners of square-shaped ceramic substrate 70. Specifically, where one of the two diagonals of ceramic substrate 70 extends in X direction and the other diagonal extends in Y direction, land portion 102b of anode line pattern 102 is arranged at one end in the X direction and land portion 104b of cathode line pattern 104 is arranged at the other end in the X direction.

Connecting portion 102a of anode line pattern 102 and connecting portion 104a of cathode line pattern 104 are arranged to extend parallel to the diagonal of square-shaped ceramic substrate 70. Specifically, connecting portion 102a of anode line pattern 102 and connecting portion 104a of cathode line pattern 104 are both arranged to extend along the X direction, and connecting portions 102a and 104a are spaced from each other by a prescribed distance in the Y direction.

Line patterns 106 and 108 are arranged to extend parallel to connecting portions 102a and 104a, between connecting portion 102a of anode line pattern 102 and connecting portion 104a of cathode line pattern 104. Line patterns 106 and 108 are spaced from each other by a prescribed distance in the Y direction. Further, line pattern 106 is spaced from connecting portion 102a of anode line pattern 102 by a prescribed distance in the Y direction, and line pattern 108 is spaced from connecting portion 104a of cathode line pattern 104 by a prescribed distance in the Y direction. The distance between each line pattern (space) is, for example, about 2 mm.

In a region between each of the line patterns 102 (102a), 106, 108 and 104 (104a), a plurality of light emitting elements 60 are directly fixed (adhered) on mounting surface 70a of ceramic substrate 70 by means of an adhesive (not shown). As the adhesive for adhering light emitting element 60, by way of example, an adhesive formed of thermosetting resin such as silicone resin, epoxy resin, acrylic resin, or imide resin may be used.

By directly adhering (mounting) light emitting elements 60 on ceramic substrate 70 in this manner, dielectric breakdown voltage determined by creeping discharge voltage can more effectively be increased. Dielectric breakdown voltage between light emitting elements arranged in the electrode direction (direction of extension of line patterns) is determined by the distance between light emitting elements and dielectric constant of the substrate, and dielectric breakdown voltage between a light emitting element and an electrode is also determined by the shortest distance between the light emitting element and the electrode and the dielectric constant of the substrate. In the present embodiment, ceramic substrate 70 having high dielectric constant is used, and light emitting elements 60 are directly mounted on ceramic substrate 70 as such. Thus, the dielectric breakdown voltage can easily be increased as described above.

Light emitting element 60 adhered on mounting surface 70a of ceramic substrate 70 is electrically connected to line pattern 100 through bonding wire 110. Further, the plurality of light emitting elements 60 are connected in series-parallel between anode line pattern 102 and cathode line pattern 104. Electric connection between light emitting element 60 and line pattern 100 is realized by bonding one end of bonding wire 110 to P-side and N-side electrodes (both not shown) of light emitting element 60 and bonding the other end of bonding wire 110 to line pattern 100. A gold line, for example, is used as bonding wire 110.

Preferably, the thickness of ceramic substrate 70 is at least 0.2 mm and at most 2.0 mm. If ceramic substrate 70 is too thin, ceramic substrate 70 becomes fragile. On the other hand, if ceramic substrate 70 is too thick, though it becomes less fragile, its heat radiation characteristic lowers. Therefore, ceramic substrate should preferably have the thickness in the range above.

Sealing body 80 sealing light emitting element 60 is formed of a light transmitting sealing material. Sealing body 80 seals the plurality of light emitting elements 60 mounted on ceramic substrate 70 and electrically connected to line pattern 100 by means of bonding wire 110. Further, by sealing light emitting elements 60, sealing body 80 also protects light emitting elements 60 and prevents disconnection of bonding wire 110. As sealing material for forming sealing body 80, light transmitting resin having high weather resistance such as epoxy resin, urea resin or silicone resin, silica sol having high light resistance, light transmitting inorganic material such as glass, may suitably be used.

In sealing body 80 described above, fluorescent substance (not shown) that is excited by the light from light emitting element 60 and emits yellow light is dispersed. Therefore, blue light emitted from light emitting element 60 and yellow light emitted from the fluorescent body excited by the light from light emitting element 60 are mixed, resulting in white light. Sealing body 80 may contain light diffusing agent (not shown), in addition to the fluorescent substance. Though not limiting, barium titanate, titanium oxide, aluminum oxide, silicon oxide, calcium carbonate, silicon dioxide or the like may suitably be used as the light diffusing agent.

Figure 3:
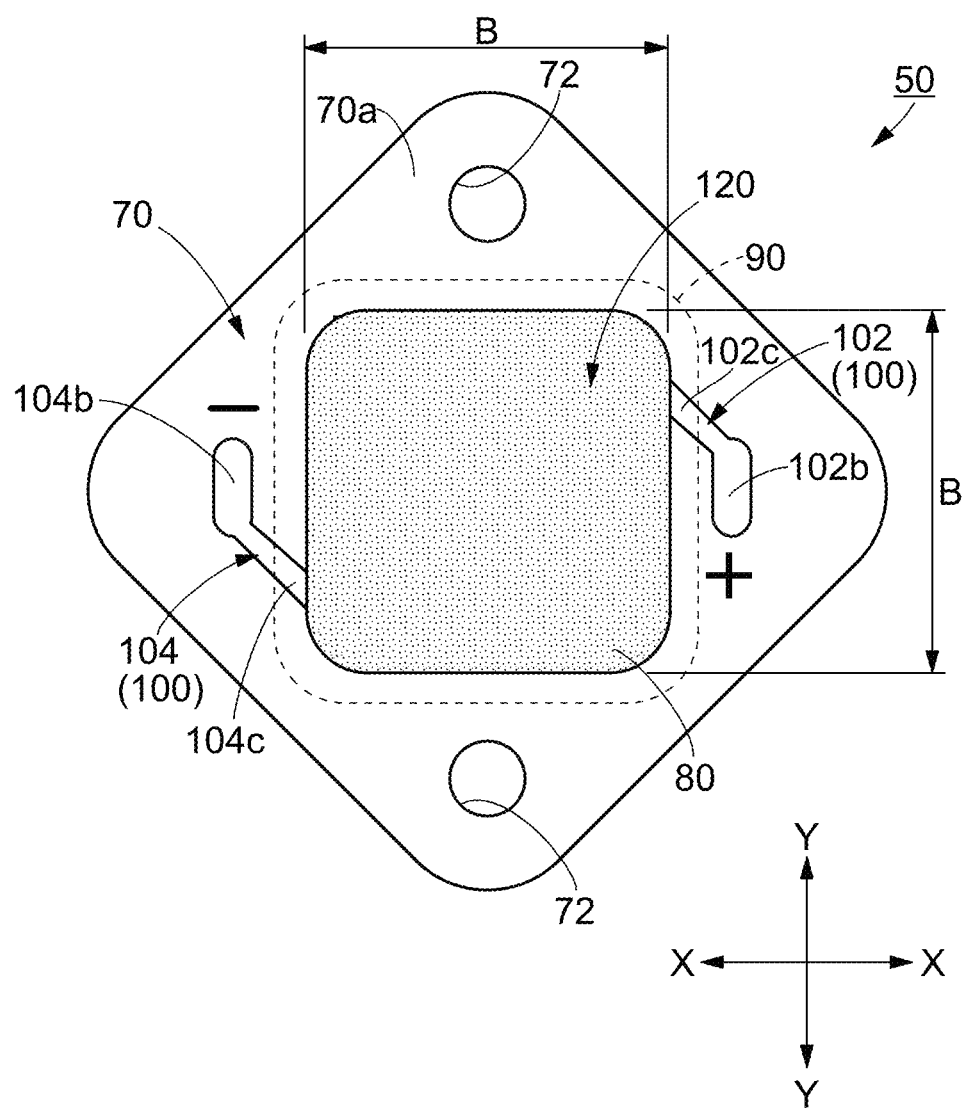
FIG. 3 is a plan view showing the light emitting device in accordance with the first embodiment of the present invention.

Referring to FIG. 3, light emitting device 50 further includes a light emitting portion 120 emitting white light. Light emitting portion 120 includes a plurality of light emitting elements 60, and sealing body 80 sealing light emitting elements 60. Sealing body 80 mentioned above is formed to have a substantially square planar shape, and it does not seal but exposes land portion 102b of anode line pattern 102 and land portion 104b of cathode line pattern 104. Length B of one side of substantially square-shaped sealing body 80 is, for example, about 1.5 cm.

Figure 4:
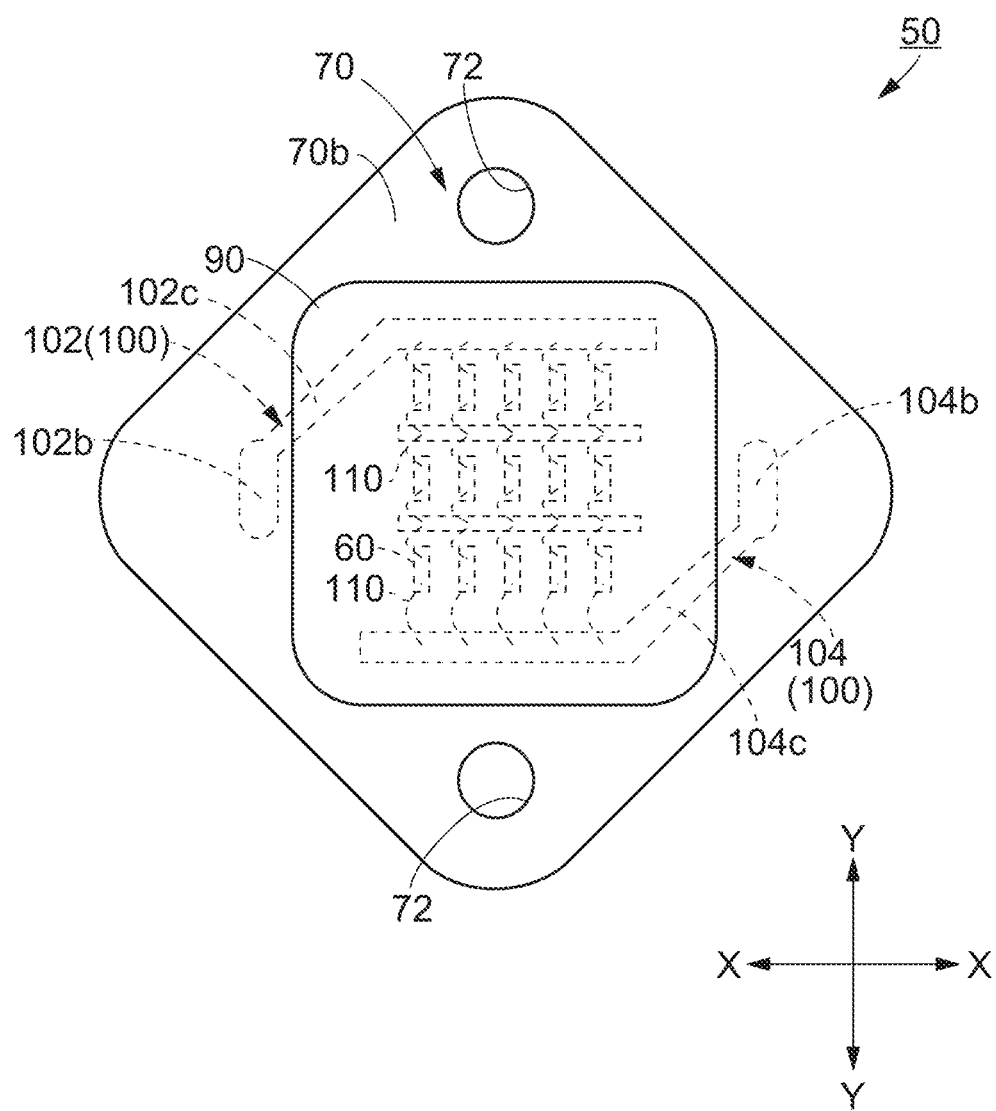
FIG. 4 is a plan view showing the light emitting device of FIG. 1 viewed from the back side.

Here, in the present embodiment, on non-mounting surface 70b of ceramic substrate 70, metal reflection film 90 as described above is formed. Referring to FIGS. 2 and 4, metal reflection film 90 reflects the light emitted from light emitting element 60 and transmitted through ceramic substrate 70. A reflection film having reflectance of light from light emitting element 60 of at least 80% is preferred as metal reflection film 90. Specifically, metal reflection film 90 is formed of a reflection film of Ag or an alloy thereof. Here, reflection film of Ag means a reflection film of pure Ag or a reflection film having a composition of an alloy of Ag as a main component and a very small amount of at least one other metal (such as Cu, Au, Pd, Nd, Sm, Sn, In, Bi, Al or the like). A film of Ag alloy means a metal film of an alloy having Ag as a main component and a metal such as mentioned above as an additive, with the Ag content being 80% or more.

Preferable thickness of metal reflection film 90 is at least 50 nm and at most 10 μm. Specifically, the thickness of metal reflection film 90 may be about 500 nm. If the thickness of metal reflection film 90 becomes smaller than 50 nm, part of light may be transmitted therethrough, possibly lowering reflectance. On the other hand, if the thickness of metal reflection film 90 becomes 10 μm or more, manufacturing cost increases and a problem of migration caused by heat may arise. In addition, heat radiation characteristic may possibly decrease. Therefore, metal reflection film 90 should preferably have the thickness in the range above.

Further, in the present embodiment, on non-mounting surface 70b of ceramic substrate 70, metal reflection film 90 is formed on a prescribed region including a region immediately below the plurality of light emitting elements 60. Specifically, the region for forming metal reflection film 90 includes the region immediately below light emitting elements 60. More specifically, metal reflection film 90 has larger two-dimensional area than sealing body 80 sealing light emitting elements 60 and it is formed to cover sealing body 80 when viewed two-dimensionally. Therefore, most of the light from light emitting elements 60 and transmitted through ceramic substrate 70 is incident on metal reflection film 90 and, therefore, the light can effectively be reflected by metal reflection film 90. Further, metal reflection film 90 is formed not to reach the end (edge) of ceramic substrate 70. It is noted that FIGS. 1, 3, and 4 show an example in which metal reflection film 90 is patterned to have a substantially square shape.

Surface roughness of non-mounting surface 70b of ceramic substrate 70 should preferably be small. Specifically, non-mounting surface 70b of ceramic substrate should preferably have higher flatness. For this purpose, in the present embodiment, non-mounting surface 70b of ceramic substrate 70 is subjected to polishing.

Figure 5:
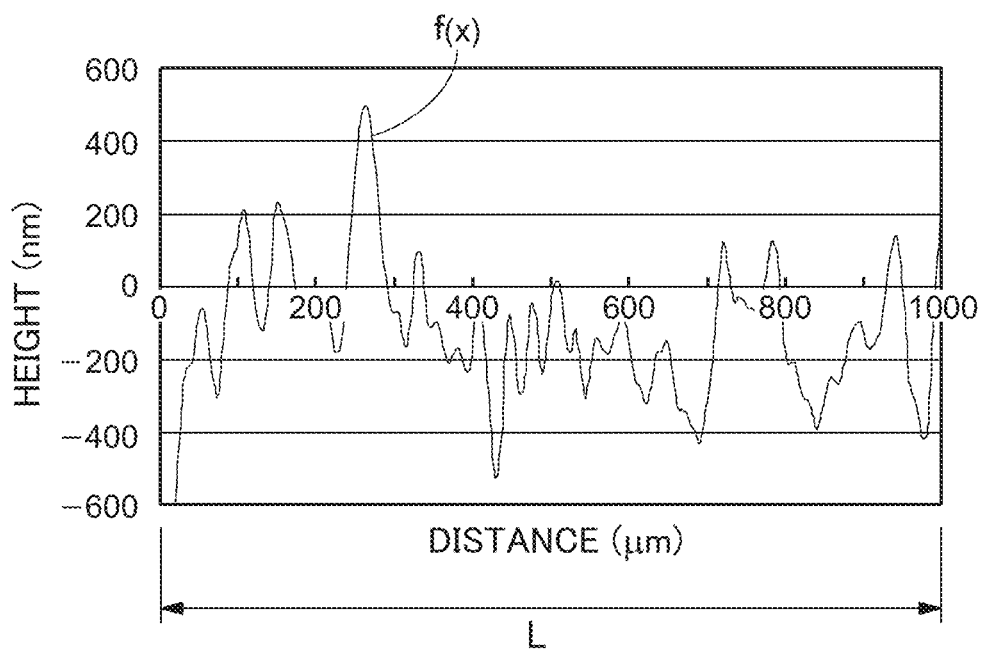
FIG. 5 shows an example of a roughness curve for describing arithmetic mean surface roughness Ra.

Here, as a measure of flatness of ceramic substrate surface, we use arithmetic mean surface roughness Ra and surface roughness in maximum height Rz, in accordance with JIS B0601-2001. Referring to FIG. 5, arithmetic mean surface roughness Ra represents a value calculated in accordance with Equation (1) below in the order of micro-meter (μm), where a reference length L only is extracted along an average line from a roughness curve, and roughness curve is represented as y=f(x), with the X axis being in the direction of average line of the extracted portion and Y axis being in the direction of vertical scale factor.

Equation (1)

$$Ra = \frac{1}{L}\int_0^L \{f(x)\}\,dx \qquad (1)$$

The roughness in maximum height Rz represents the sum of maximum height and maximum depth of a roughness curve of a reference length.

Here, preferably, the roughness in maximum height Rz of non-mounting surface 70b of ceramic substrate 70 is made equal to or smaller than the wavelength of light emitted from light emitting element 60. By way of example, if the wavelength of light emitted from light emitting element 60 is 450 nm, the roughness in maximum height Rz should be at most 450 nm.

Surface roughness of non-mounting surface 70b of ceramic substrate 70 (arithmetic mean surface roughness Ra: hereinafter, also simply denoted as Ra) should preferably be at most 0.04 μm. With such a value, the reflectance can effectively be improved, as will be described later.

By forming metal reflection film 90 on non-mounting surface 70b having small surface roughness, loss of light at the interface between non-mounting surface 70b and metal reflection film 90 can be reduced, as will be described later. Therefore, luminous flux of light emitted by metal reflection film 90 increases.

Light emitting device 50 as such is mounted as a light source of an illuminating device, for example, for general illumination. Therefore, a fixing hole 72 (see FIG. 1) for fixing on the counterpart member is provided in ceramic substrate 70 of light emitting device 50. Specifically, at opposite corners of substantially square-shaped ceramic substrate 70, fixing holes 72 passing through the thickness of ceramic substrate 70 are formed. These two fixing holes 72 are arranged on a diagonal of ceramic substrate 70.

Referring to FIGS. 1 and 6, the method of manufacturing light emitting device 50 in accordance with the present embodiment will be described.

First, ceramic substrate 70 formed of white ceramic is prepared. Ceramic substrate 70 may be formed of high-temperature fired ceramic, or of low-temperature co-fired ceramic. When low-temperature co-fired ceramic is used, the low-temperature co-fired ceramic should preferably be a sintered body of glass powder and ceramic powder as materials. As the glass powder, one including at least one selected from the group consisting of silica glass, soda-lime glass, borosilicate glass, alumino-borosilicate glass, zinc borosilicate glass, alumino-silicate glass and phosphate glass may be used. As the ceramic powder, one containing at least one selected from the group consisting of $SiO_2$, $Al_2O_3$, $ZrO_2$, $TiO_2$, ZnO, $MgAl_2O_4$, $ZnAl_2O_4$, $MgSiO_3$, $MgSiO_4$, $Zn_2SiO_4$, $Zn_2TiO_4$, $SrTiO_3$, $CaTiO_3$, $MgTiO_3$, $BaTiO_3$, $CaMgSi_2O_6$, $SrAl_2Si_2O_8$, $BaAl_2Si_2O_8$, $CaAl_2Si_2O_8$, $Mg_2Al_4Si_5O_{18}$, $Zn_2Al_4Si_5O_{18}$, AlN, SiC, mullite and zeolite may be used.

Preferably, the thickness of ceramic substrate 70 is at least 0.2 mm and at most 2.0 mm (for example, about 1 mm). The thickness of ceramic substrate 70 may appropriately be adjusted through the subsequent polishing step.

Next, as shown in FIG. 6(a), on one surface of ceramic substrate 70 (on the surface on which light emitting element 60 is to be mounted), line pattern 100 is formed. Specifically, a gold film having the thickness of about 0.07 mm is formed, for example, by sputtering and, thereafter the film is patterned to a prescribed shape by photo-etching. In this manner, pattern 100 of the plurality of lines shown in FIG. 1 is formed. By way of example, in line pattern 100, the width of connecting portion may be about 1 mm and the space between line patterns may be about 2 mm.

Thereafter, the other surface (non-mounting surface 70b), on which the line pattern is not formed, of ceramic substrate 70 is polished to improve flatness of the surface. As to the method of polishing, any method generally used for polishing ceramics may be used without problem. Specifically, by way of example, on a supporting base (not shown), a plurality of ceramic substrates may be attached, and by grinding, the surface of ceramic substrates is ground-off. Grinding method as such is a processing method of removing the surface of a work piece by a grinder. Next, at the step of polishing, small irregularities on the surface is removed. At this step, while a polishing liquid containing polishing agent and lubricant is supplied to a surface of a plate (polishing apparatus: not shown), non-mounting surface 70b of ceramic substrate 70 is polished, using the plate and the polishing liquid. At the time of polishing, preferably, the plate is rotated. The polishing liquid is dripped from a dripping nozzle of a dripping device (all not shown) to the surface of the plate.

As the polishing material, diamond having the particle diameter of 6 μm may be used. When diamond having large particle diameter is used, irregularities on the surface of ceramic substrate 70 increases, and surface flatness decreases. Therefore, use of polishing material having small particle size is preferred.

After this step, buffing may be conducted. The buffing step is to clean the metal surface. At this step, abrasive grains (for example, chrome-based polishing material, alumina-based polishing material or the like) is applied to a soft, flexible buff such as cotton or linen (for example, polishing product formed of cloth, such as a polishing pad or a flap buff), and the buff is rotated at high-speed while it is pressed on the work piece to polish the surface.

In this manner, ceramic substrate 70 for mounting light emitting elements 60 is obtained.

Next, as shown in FIG. 6(b), on the other, polished surface (non-mounting surface 70b) of ceramic substrate 70, metal reflection film 90 is formed. Metal reflection film 90 may be formed, for example, by vapor deposition using EB (Electron Beam) vapor deposition device, sputtering using a sputtering device, or CVD (Chemical Vapor Deposition). As the sputtering device, by way of example, a magnetron sputtering device, an ECR (Electron Cyclotron Resonance) sputtering device, a parallel plate type sputtering device or the like may be used. The metal film formed by vapor deposition, sputtering, CVD or the like is patterned, for example, by photo etching, so that metal reflection film 90 is obtained. The material of metal reflection film is Ag or its alloy. Preferable thickness of metal reflection film 90 is at least 50 nm and at most 10 μm.

Thereafter, as shown in FIG. 6(c), a plurality of light emitting elements 60 formed of LED chips are mounted on ceramic substrate 70. Specifically, on the surface (mounting surface 70a) opposite to the surface on which metal reflection film 90 is formed, light emitting elements 60 are mounted using an adhesive (not shown). The plurality of light emitting elements 60 are arranged in the regions between adjacent line patterns 100. Light emitting elements 60 are mounted by directly adhering the elements on ceramic substrate 70 using a thermosetting resin such as silicone resin, epoxy resin, acrylic resin or imide resin. By doing so, the dielectric breakdown voltage determined by the creeping discharge voltage can be increased as high as possible.

Next, as shown in FIG. 6(d), in accordance with the desired state of electric connection, light emitting elements 60 mounted on ceramic substrate 70 and line pattern 100 are electrically connected, using bonding wire 110.

Next, as shown in FIG. 6(e), on mounting surface 70a of ceramic substrate 70, sealing body 80 sealing light emitting elements 60 is formed. As the sealing material of sealing body 80, light transmitting resin having high weather resistance such as epoxy resin, urea resin or silicone resin, silica sol having high light resistance, light transmitting inorganic material such as glass is preferred. In the sealing material, a fluorescent substance that is excited by the blue light from light emitting element 60 and emits yellow light is dispersed. Light diffusing agent may be added to the sealing material. As the material of light diffusing agent, Sb based diffusing agent, and diffusing agent containing calcium carbonate, silicon oxide, or titanium oxide as a main component are known, and any of these may be used.

In the present embodiment, at the step of sealing light emitting elements 60 by sealing body 80, first, the sealing material (resin material) containing the fluorescent substance is applied to the mounting surface 70a of ceramic substrate 70. Here, the sealing material (resin material) is applied to seal the light emitting elements 60 on ceramic substrate 70. It is noted, however, that land portions 102b and 104b of line pattern 100 (see FIG. 1) are not sealed. Next, the sealing material applied to mounting surface 70a of ceramic substrate 70 is cured. As the method of curing sealing material, an appropriate method in accordance with the used sealing material may be applied without any specific limitation. By way of example, when silicone resin as a light transmitting resin material is used as the sealing material, the sealing material is cured by thermal curing.

Through the above-described method, light emitting device 50 of the present embodiment is obtained.

Light emitting device 50 in accordance with the present embodiment operates in the following manner.

Referring to FIG. 2, when power is supplied to line pattern 100 of ceramic substrate 70, a current flows through light emitting element 60 and blue light is emitted from light emitting elements 60 (see dotted arrows). The light excites the fluorescent substance dispersed in sealing body 80, and the fluorescent substance emits yellow light. The blue light from light emitting elements 60 and the yellow light from fluorescent substance are mixed, so that white light is emitted from light emitting portion 120 of light emitting device 50.

Part of light emitted from light emitting elements 60 also reaches ceramic substrate 70. Ceramic substrate 70 is made thin to improve heat radiating characteristic. Therefore, part of light from light emitting elements 60 that is incident on ceramic substrate 70 (see chain-dotted arrows of FIG. 2) passes through ceramic substrate 70 and is incident on the metal reflection film 90 formed on the back side surface (non-mounting surface 70b) of ceramic substrate 70. The light incident on metal reflection film 90 is reflected upward by metal reflection film 90, and taken out from the top surface (mounting surface 70a) of ceramic substrate 70. Further, part of light emitted from the excited fluorescent substance also reaches ceramic substrate 70. The light from fluorescent substance incident on ceramic substrate 70 passes through ceramic substrate 70 and reflected by metal reflection film 90, and taken out from the top surface (mounting surface 70a) of ceramic substrate 70. Thus, decrease in reflectance of ceramic substrate 70 is prevented, and illuminance can be improved.

Figure 7:
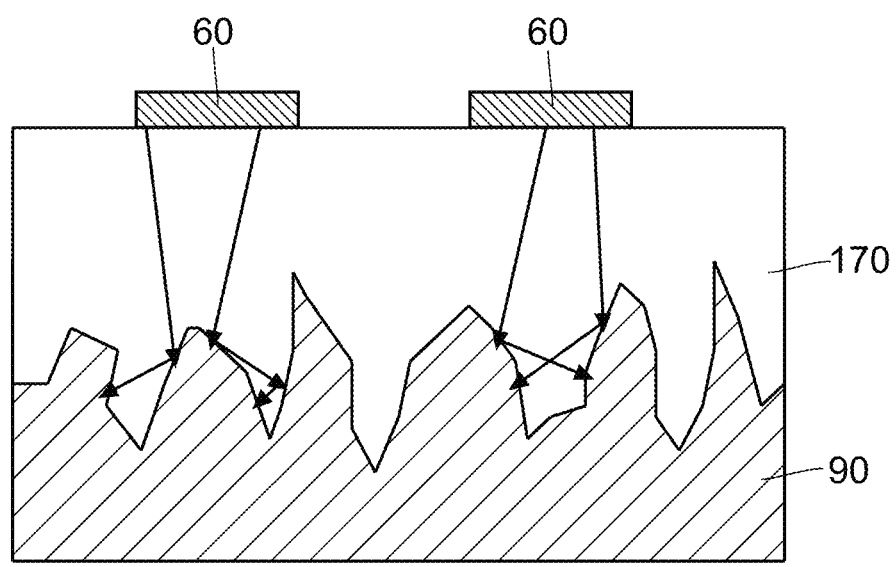
FIG. 7 is a schematic cross-sectional view illustrating the reason why the reflectance improves when the surface roughness of non-mounting surface of the ceramic substrate is made smaller.
Figure 8:
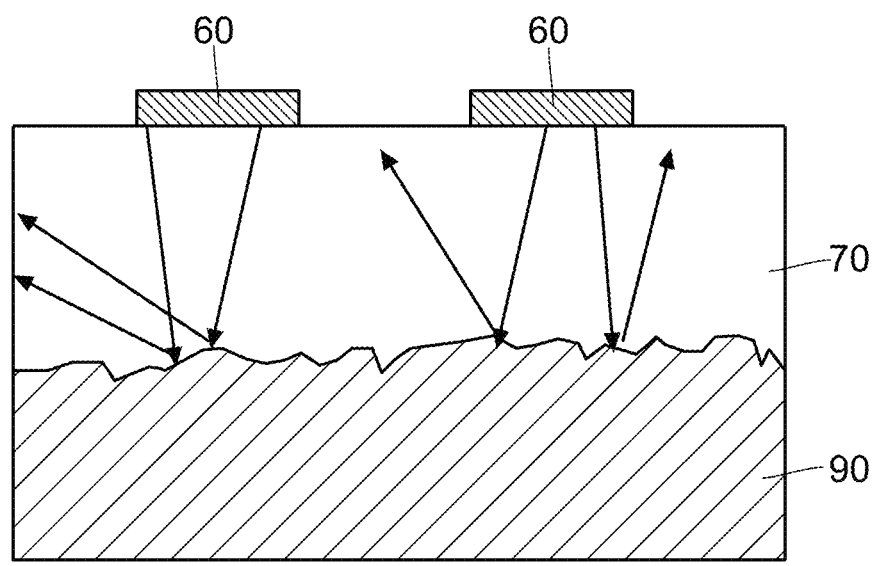
FIG. 8 is a schematic cross-sectional view illustrating the reason why the reflectance improves when the surface roughness of non-mounting surface of the ceramic substrate is made smaller.

Next, referring to FIGS. 7 and 8, the reason why reflectance increases when the surface roughness of non-mounting surface 70b of ceramic substrate 70 is made smaller will be described. Referring to FIG. 7, consider a ceramic substrate 170, of which non-mounting surface has very high surface roughness Ra. Here, the light emitted from light emitting elements 60 and the light emitted from fluorescent substance passes through ceramic substrate 170 and reaches an interface between ceramic substrate 170 and metal reflection film 90. The arriving light causes multiple reflections there. Since reflectance of metal reflection film 90 is not 100%, the amount of light decreases as the light is absorbed by metal reflection film 90 because of multiple reflections. On the other hand, referring to FIG. 8, in a ceramic substrate 70 of which non-mounting surface has low surface roughness Ra, the number of multiple reflections at the interface becomes smaller. Therefore, optical loss becomes smaller and reflectance improves, as compared with the example having high Ra.

In the present embodiment, since metal reflection film 90 is formed on non-mounting surface 70b of ceramic substrate 70, the light from light emitting elements 60 that has passed through ceramic substrate 70 can be reflected by metal reflection film 90. When ceramic substrate 70 is made thin to improve heat radiation characteristic, though the light from light emitting elements 60 passes through ceramic substrate 70, the transmitted light is reflected upward by metal reflection film 90. Therefore, even when ceramic substrate 70 is made thin, reflectance of ceramic substrate 70 can be improved. Further, as the thickness of ceramic substrate 70 is reduced, the effect of improved heat radiation can also be attained. Therefore, by the above-described structure, reflectance of ceramic substrate 70 can be improved and at the same time, heat radiation can be improved.

Since the surface roughness in maximum height Rz of non-mounting surface 70b of ceramic substrate 70 is made equal to or smaller than the wavelength of light emitted from light emitting elements 60, scattering of light at the interface between non-mounting surface 70b and metal reflection film 90 can be reduced, and the reflectance can effectively be improved.

When arithmetic mean surface roughness Ra of non-mounting surface 70b of ceramic substrate 70 is made 0.04 μm or smaller, the scattering of light at the interface between non-mounting surface 70b and metal reflection film 90 can easily be reduced, and the reflectance can more effectively be improved.

Preferable thickness of ceramic substrate 70 is at least 0.2 mm and at most 2.0 mm. With the thickness of ceramic substrate within this range, the effect of improving heat radiation and the effect of improving reflectance by metal reflection film 90 can effectively be attained. Further, the problem of ceramic substrate 70 becoming fragile as ceramic substrate 70 is made too thin can be prevented.

Since metal reflection film 90 is made of a reflection film of Ag or its alloy, the light that has passed through the ceramic substrate can effectively be reflected by metal reflection film 90. Thus, the light extraction efficiency can effectively be improved.

Further, since metal reflection film 90 is formed to include the region immediately below light emitting elements 60, the light from light emitting elements 60 comes to be more easily reach metal reflection film 90. Therefore, the light that has passed through ceramic substrate 70 can more easily be reflected by metal reflection film 90.

Further, when ceramic substrate 70 is formed of an alumina sintered body, the reflectance can further be improved, since the substrate formed of alumina sintered body has high reflectance.

Further, as metal reflection film 90 is formed not to be in contact with the edge of ceramic substrate 70, insulation failure or the like caused by heat migration of Ag contained in metal reflection film 90 can be prevented.

It is noted that light from light emitting elements 60 excites the fluorescent substance contained in sealing body 80, and part of light emitted from excited fluorescent substance reaches ceramic substrate 70 while the light from fluorescent substance reaching ceramic substrate 70 passes through ceramic substrate 70 and reflected by metal reflection film 90. Therefore, the reflection by metal reflection film 90 is effective not only for the light from light emitting elements 60 but also for the excited light.

Figure 9:
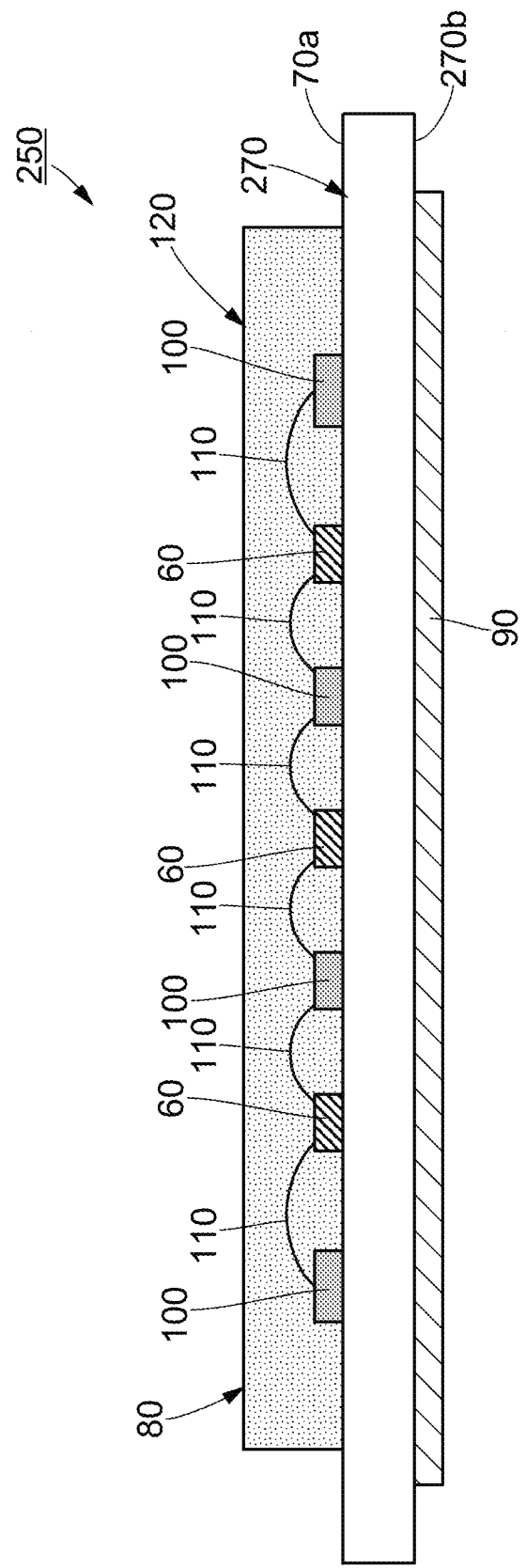
FIG. 9 is a cross-sectional view showing a structure of the light emitting device in accordance with a second embodiment of the present invention.

Referring to FIG. 9, a light emitting device 250 in accordance with the present embodiment includes a ceramic substrate 270, in place of ceramic substrate 70 (see FIG. 2) in accordance with the first embodiment. A non-mounting surface 270b of ceramic substrate 270 is not polished and, therefore, surface roughness of non-mounting surface 270b is larger than that of the first embodiment.

The method of manufacturing light emitting device 250 in accordance with the present embodiment is similar to that of the first embodiment. It is different from the first embodiment, however, in that the method does not include the polishing step of polishing non-mounting surface 270b of ceramic substrate 270.

The operation and effects of light emitting device 250 in accordance with the present embodiment are the same as those of the first embodiment.

Figure 10:
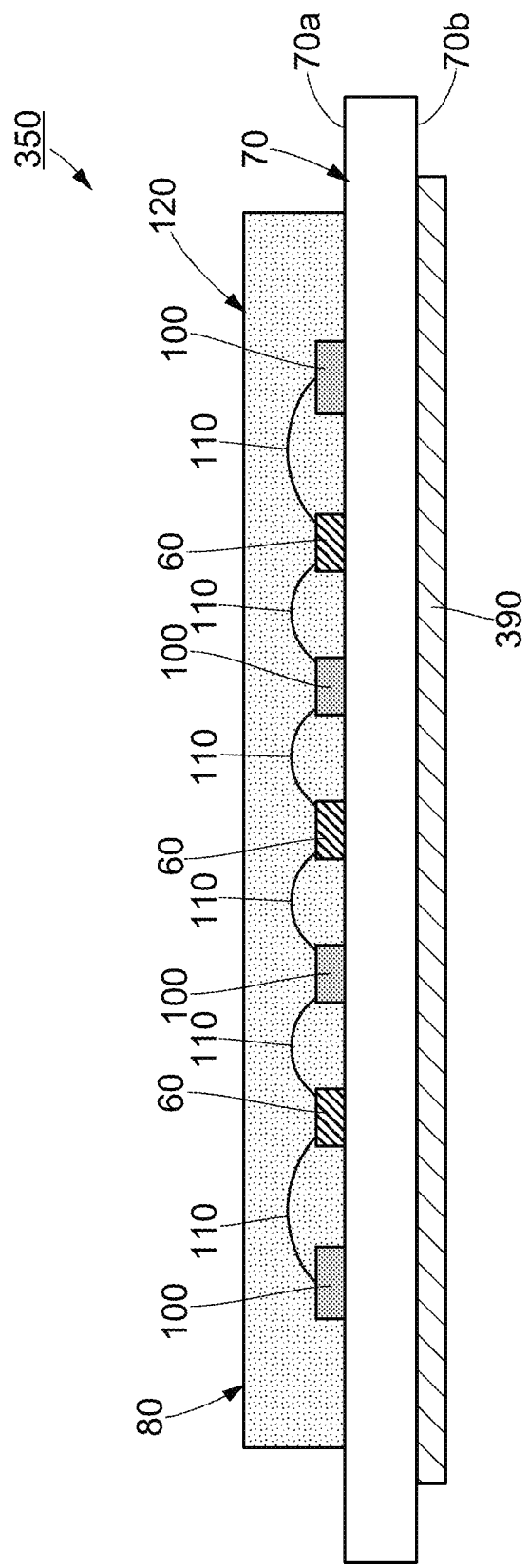
FIG. 10 is a cross-sectional view showing a structure of the light emitting device in accordance with a third embodiment of the present invention.

Referring to FIG. 10, a light emitting device 350 in accordance with the present embodiment includes a metal reflection film 390 in place of metal reflection film 90 (see FIG. 2) of light emitting device 50 (see FIG. 2) in accordance with the first embodiment. Metal reflection film 390 is formed of a reflection film of Al or its alloy. Specifically, though light emitting device 350 in accordance with the present embodiment is similar to light emitting device 50 in accordance with the first embodiment, it is different from light emitting device 50 including metal reflection film 90 formed of a reflection film of Ag or its alloy, in that metal reflection film 390 is formed of a reflection film of Al or its alloy.

The reflection film of Al refers to a metal film including a film of which composition contains Al as a main component and alloyed by adding one or more of Fe, Co, Ni, Ru, Rh, Pd, Os, Ir, Pt, V, Nb, Ta, Cr, Mo, W, Mn, Tc, Re, Ti, Zr, Hf, Mg, Sc, Y, La, Gd, Tb, Lu and Ag. An Al alloy film refers to a metal film containing Al as a main component, containing 80% or more of Al and a metal listed above as an additive.

The method of manufacturing light emitting device 350 in accordance with the present embodiment is similar to the first embodiment except that a reflection film of Al or its alloy is formed, when metal reflection film 390 is formed. As in the first embodiment, metal reflection film 390 can also be formed in the manner similar to the first embodiment described above, by the vapor deposition method using EB vapor deposition device, sputtering method using a sputtering device, or by using the CVD method. Metal reflection film 390 can be patterned in the similar manner. Preferable thickness of metal reflection film 390 is at least 50 nm and at most 10 μm.

The operation and effects of light emitting device 350 in accordance with the present embodiment are the same as those of the first embodiment.

The same light emitting device as light emitting device 50 in accordance with the first embodiment was manufactured as Example 1. In Example 1, a substrate formed of alumina sintered body was used as the ceramic substrate. The thickness of ceramic substrate was 1 mm.

As to the surface roughness of non-mounting surface of ceramic substrate, arithmetic mean surface roughness Ra was 0.02 μm, and surface roughness in maximum height Rz was about 200 nm. On the non-mounting surface of ceramic substrate, a reflection film of Ag alloy was formed as the metal reflection film. The Ag alloy was an alloy of Ag, Pd and Cu, and contents of Pd and Cu were each at most 1%. The thickness of metal reflection film was about 250 nm. As the light emitting element, blue LED chip was used. The dimension of light emitting element was as follows: shorter side width 0.24 mm, longer side 0.48 mm, thickness 0.14 mm.

A ceramic substrate formed of alumina sintered body was prepared, and a line pattern was formed on one surface (mounting surface) of the ceramic substrate. Specifically, by sputtering, a gold film was formed to the thickness of about 0.07 mm on the upper surface of ceramic substrate, and patterned by photo-etching, whereby the line pattern was obtained.

Next, the other surface of ceramic substrate (the surface opposite to the one surface having the line pattern: non-mounting surface) was polished. At the polishing step, diamond particles having the particle diameter of 6 μm was used as the polisher. When diamond having large particle diameter is used, irregularities increases, and surface flatness decreases. Therefore, the substrate having large surface roughness Ra was polished using diamond particle having the diameter of 6 μm first, and thereafter, again polished using diamond particles having the diameter of 2 μm, to reduce Ra. The time for polishing was about 1 hour.

Thereafter, buffing using silica of very fine particle diameter was conducted for about 1 to about 2 hours. After the polishing step, the surface roughness was measured, using a surface roughness meter (stylus thickness meter). Arithmetic mean surface roughness Ra was measured with reference length L=1 mm.

Thereafter, by sputtering, an Ag alloy (an alloy of Ag, Pd and Cu: contents of Pd and Cu were each 1% or smaller) film was formed on the non-mounting surface of ceramic substrate. The film thickness was about 250 nm. By patterning the Ag alloy film, the metal reflection film was obtained.

Thereafter, on the mounting surface of ceramic substrate, a plurality of light emitting elements were adhered, using epoxy resin. The light emitting elements mounted on the ceramic substrate were electrically connected to the line pattern, using a bonding wired of thin gold line. Then, the light emitting elements were sealed by a sealing body containing fluorescent substance.

Figure 11:
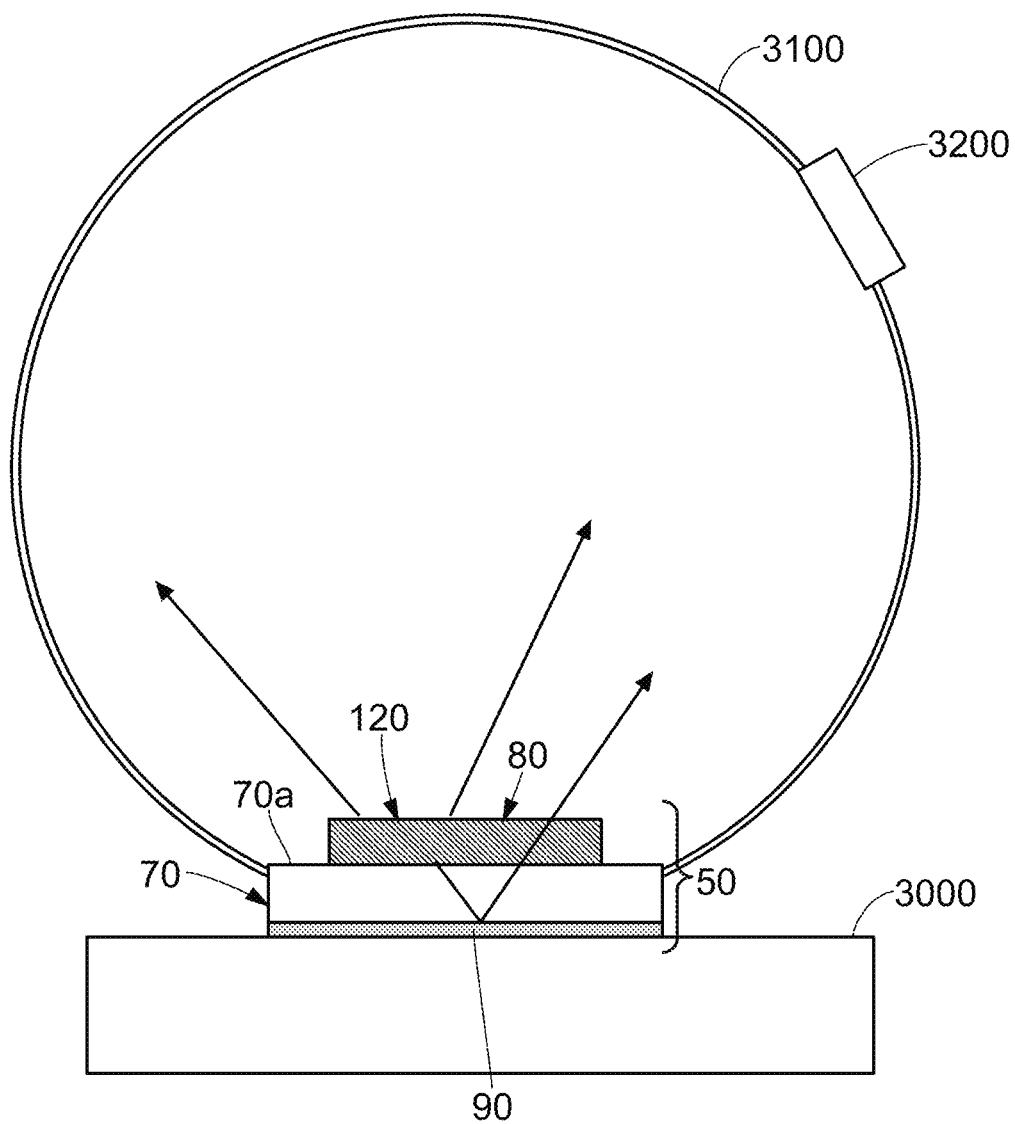
FIG. 11 shows a device for measuring luminous flux of the light emitting device.

Using the light emitting device of Example 1, luminous flux (lumen: lm) was measured. Specifically, a constant DC current of 700 mA was caused to flow through light emitting elements in a room temperature environment, and the luminous flux of light emitted from the light emitting device at that time was measured. The luminous flux was measured as shown in FIG. 11, in which light emitting device 50 is placed on a stage 300 of the measuring device, an integrating sphere 3100 was set such that the upper surface of light emitting device 50 is received by an integrating sphere 3100, and a current was caused to flow to light emitting device 50 and the light was emitted. Thereafter, luminous flux was measured by a light receiving element 3200 attached to integrating sphere 3100, with the light emitted upward from mounting surface 70a of ceramic substrate 70 having the light emitting elements mounted thereon being entirely received by integrating sphere 3100.

In order to compare the luminous flux with that of Example 1, a light emitting device having arithmetic surface roughness Ra of 0.16 μm and not having the metal reflection film on the non-mounting surface was manufactured.

Though the manufacturing method is similar to Example 1, it is different from Example 1 in that the polishing step of polishing the non-mounting surface of ceramic substrate is omitted, and that the step of forming metal reflection film was not conducted.

In order to compare the luminous flux with that of Example 1, evaluation similar to that of Example 1 was executed.

In the light emitting device of Comparative Example 1, the luminous flux was 2400 lm, and the voltage (the voltage across the light emitting device as a whole) was 38.2 V. In contrast, in the light emitting device of Example 1, the luminous flux was 2472 lm, and the luminous flux was increased by about 3% from Comparative Example 1. The voltage was comparable. The reason for this may be that in Example 1, the light emitted from light emitting elements was reflected by the metal reflection film formed on the non-mounting surface of ceramic substrate and emitted upward of the mounting surface. Further, the light emitted from light emitting elements and emitted through the fluorescent substance contained in the sealing body was also reflected by the metal reflection film on the back side surface of ceramic substrate and included in the amount of light extracted at the upper portion of light emitting device. In the light emitting device of Comparative Example 1, transmitted light was observed at the non-mounting surface of ceramic substrate. From the foregoing, it was confirmed that when a metal reflection film was formed on the non-mounting surface of ceramic substrate, the metal reflection film functioned effectively.

In order to evaluate thickness dependency of ceramic substrate (influence of thickness on the luminous flux), a plurality of different types of light emitting devices having ceramic substrates of different thicknesses were manufactured. Other structures and the manufacturing method of light emitting devices are the same as those of Example 1. Using these light emitting devices, the luminous flux of each light emitting device was measured, by the similar method as Example 1.

In order to compare the luminous flux with that of Example 2, a plurality of different types of light emitting devices having ceramic substrates of different thicknesses were manufactured. The thicknesses of respective light emitting devices were the same as those of Example 2. Other structures and the manufacturing method of light emitting devices are the same as those of Comparative Example 1. Using these light emitting devices, the luminous flux of each light emitting device was measured, by the similar method as Example 1.

When Example 2 and Comparative Example 2 having the same thickness were compared, the luminous flux was higher in Example 2 than Comparative Example 2. In Comparative Example 2, as the thickness of ceramic substrate becomes smaller, the amount of light transmitted from non-mounting surface increased. Therefore, there was a tendency that as the thickness of ceramic substrate decreased, the luminous flux measured by integrating sphere 3100 (see FIG. 11) decreased. In contrast, since the metal reflection film was formed, in light emitting devices of Example 2, luminous flux hardly decreased even when the thickness of ceramic substrate was different.

Figure 12:
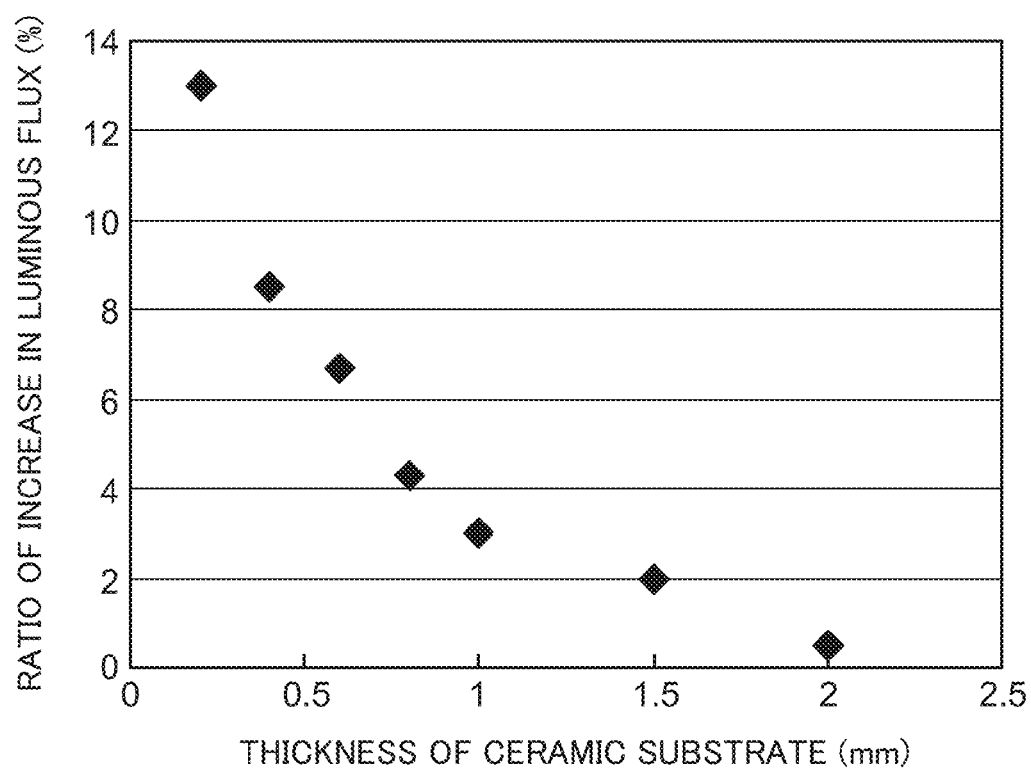
FIG. 12 shows the ratio of increase of luminous flux of Example 2 with respect to Comparative Example 2.

The ratio of increase in luminous flux of Example 2 as compared with Comparative Example 2 as a reference is as shown in FIG. 12. In FIG. 12, the abscissa represents thickness (mm) of ceramic substrate, and the ordinate represents the ratio (%) of increase in luminous flux of the light emitting devices. Referring to FIG. 12, the ratio of increase in luminous flux tends to increase as the thickness of ceramic substrate becomes smaller. Specifically, it is found that the effect of improving reflectance attained by the metal reflection film is heightened as the thickness of ceramic substrate becomes smaller.

The preferable thickness of ceramic substrate was at least 0.05 mm and at most 2.0 mm and most preferable thickness was at least 0.2 mm and at most 1.5 mm. If the thickness of ceramic substrate is 2 mm or larger, the amount of light that passes through and reaches the back surface of substrate becomes small, and the effect of reflection attained by the metal reflection film is mitigated. When heat radiation is considered, the ceramic substrate should not be too thick. On the other hand, when the thickness of ceramic substrate is 0.05 mm or smaller, the strength of ceramic substrate significantly reduces and the substrate tends to crack at the time of fixing, resulting in lower yield. Therefore, the thickness of ceramic substrate should preferably be in the range mentioned above.

In order to evaluate dependency on the surface roughness of non-mounting surface of ceramic substrate (influence of surface roughness on the luminous flux), a plurality of different types of ceramic substrates having non-mounting surfaces of different surface roughnesses were prepared. The non-mounting surfaces of ceramic substrates had five different surface roughnesses (arithmetic mean surface roughness) Ra of 0.16 μm, 0.081 μm, 0.06 μm, 0.04 μm and 0.014 μm. On the non-mounting surface of each ceramic substrate, metal reflection film was formed.

Though ceramic substrates of Example 3 were similar to those of Example 1, Example 3 is different from Example 1 in that the thickness of metal reflection film was 500 nm and that surface roughness of non-mounting surface was varied.

The manufacturing method was similar to that of Example 1. It is noted, however, that in Example 3, different from Example 1, at least one of diamond particle diameter and the polishing time was adjusted at the polishing step to fabricate a plurality of different types of ceramic substrates having different surface Ra. Further, it is noted that the ceramic substrate of Ra=0.16 μm was manufactured without the polishing step.

Using ceramic substrates before forming metal reflection film, the surface roughness of non-mounting surface of ceramic substrates was measured, using stylus thickness meter. The ceramic substrates used for measurement had non-mounting surfaces of four different surface roughnesses Ra, that is, 0.16 μm, 0.081 μm, 0.04 μm, and 0.014 μm. The results are shown in FIGS. 13 to 16. In FIGS. 13 to 16, the ordinate represents the depth (height) of irregularities. The unit is nm (nano meter). The abscissa represents reference length (distance (μm)).

Figure 13:
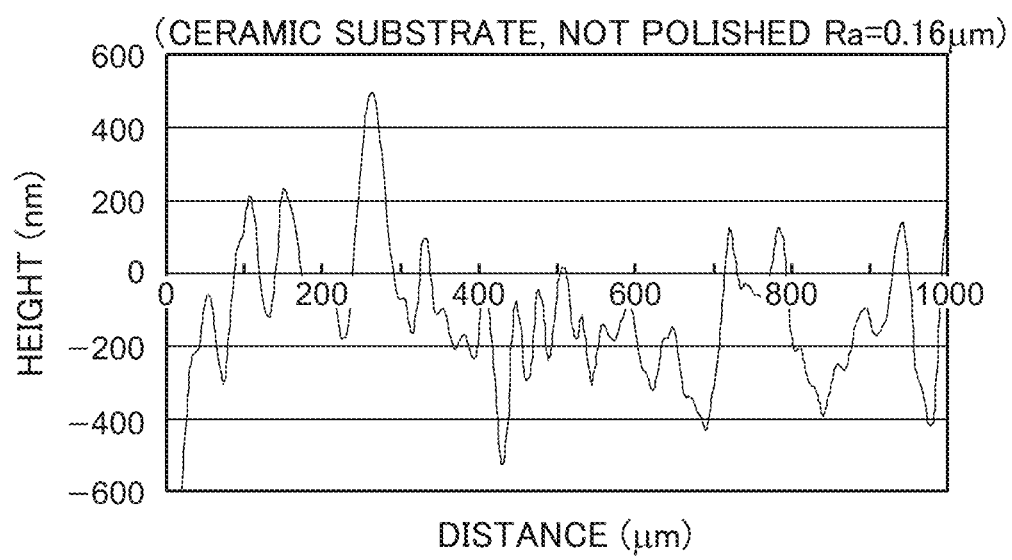
FIG. 13 shows a result of measurement of surface roughness of the non-mounting surface of ceramic substrate.
Figure 14:
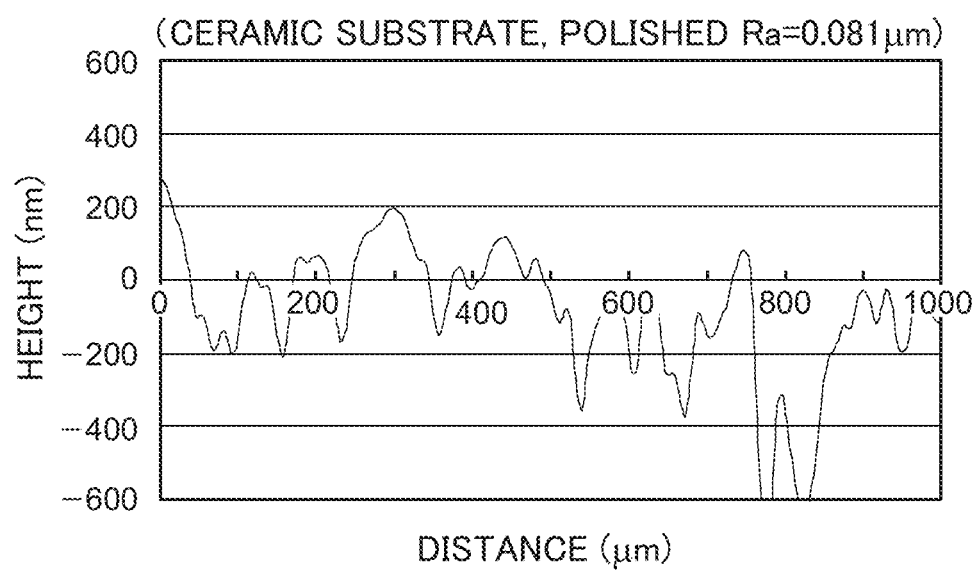
FIG. 14 shows a result of measurement of surface roughness of the non-mounting surface of ceramic substrate.
Figure 15:
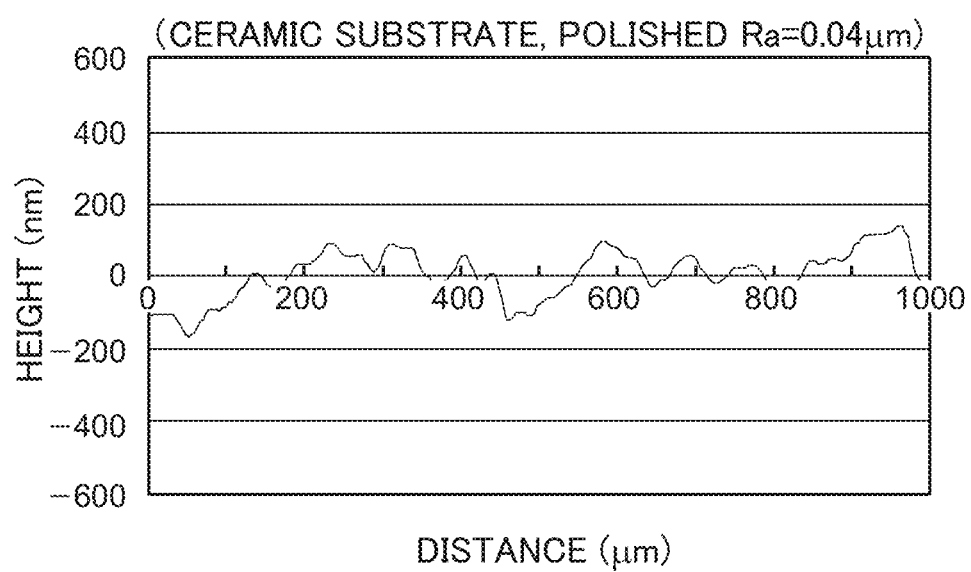
FIG. 15 shows a result of measurement of surface roughness of the non-mounting surface of ceramic substrate.
Figure 16:
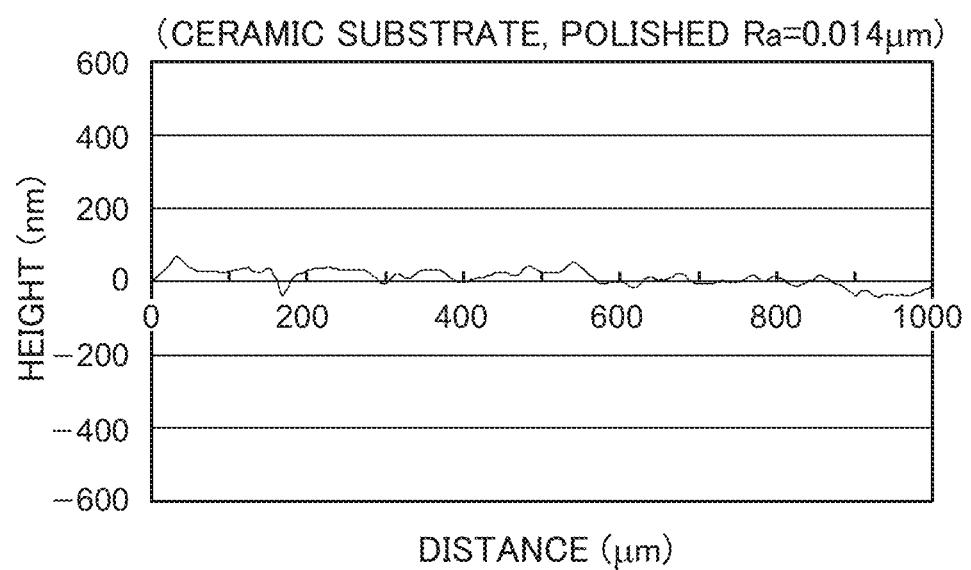
FIG. 16 shows a result of measurement of surface roughness of the non-mounting surface of ceramic substrate.
Figure 17:
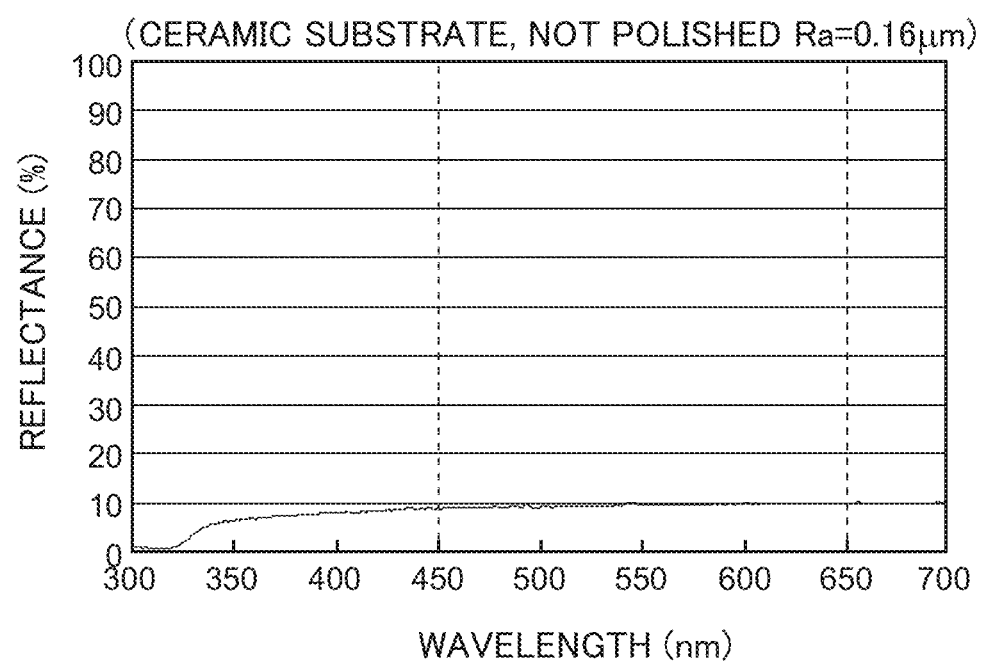
FIG. 17 shows a result of measurement of reflectance of the ceramic substrate.
Figure 18:
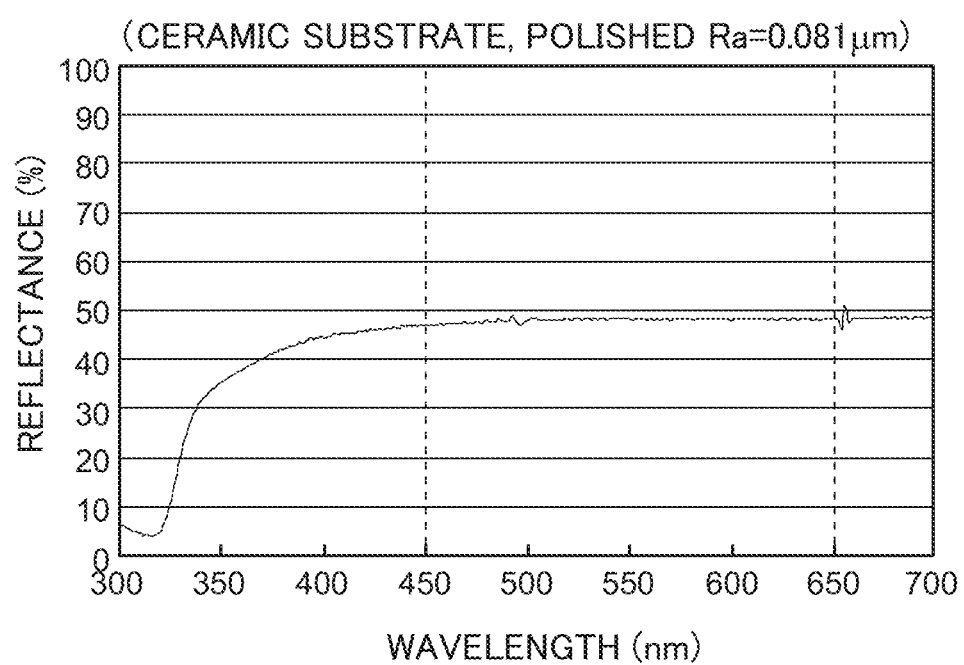
FIG. 18 shows a result of measurement of reflectance of the ceramic substrate.
Figure 19:
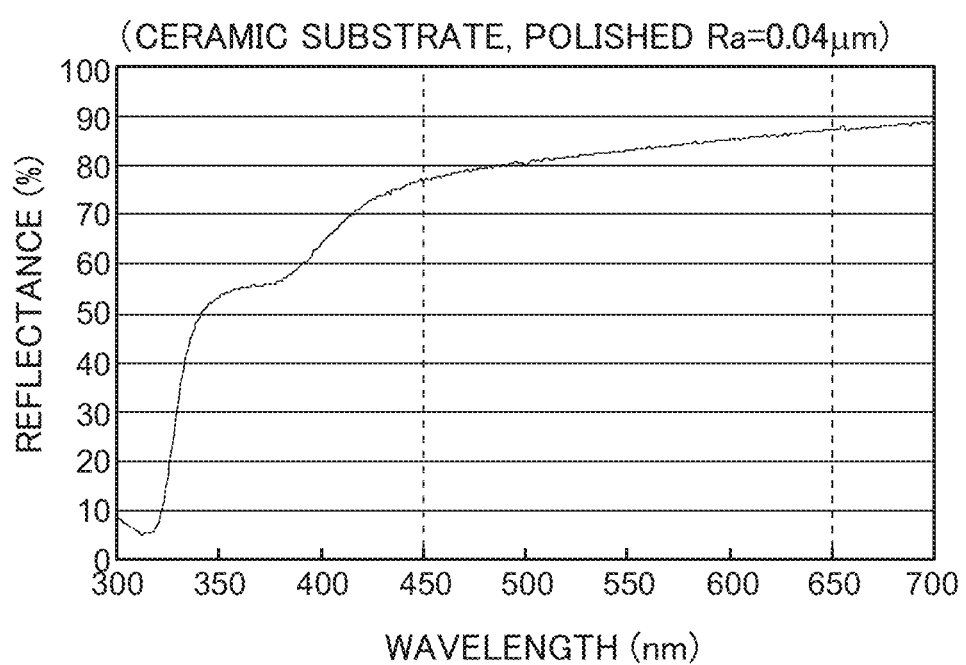
FIG. 19 shows a result of measurement of reflectance of the ceramic substrate.
Figure 20:
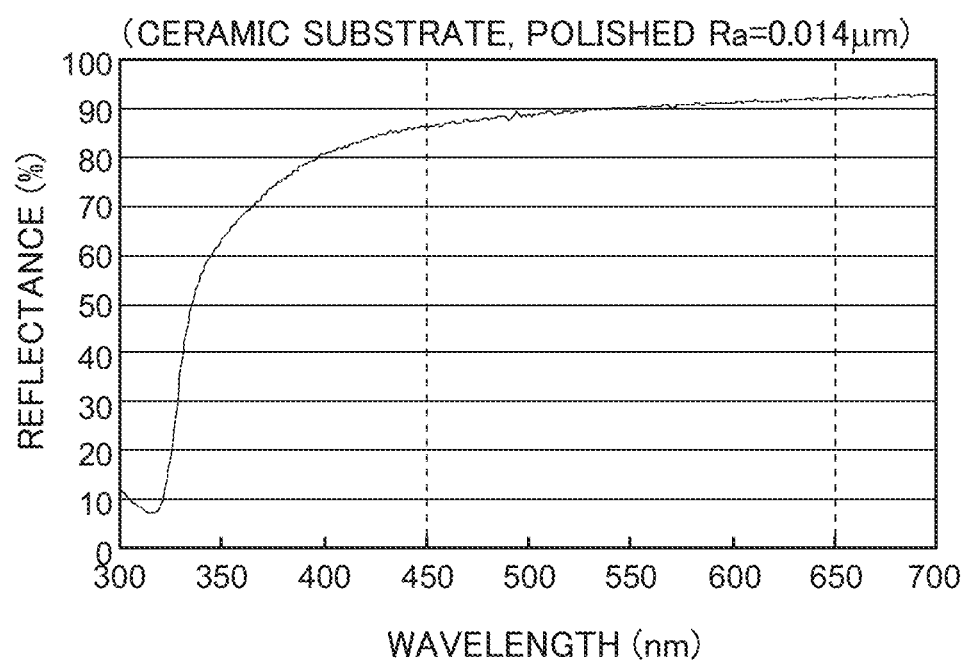
FIG. 20 shows a result of measurement of reflectance of the ceramic substrate.

Referring to FIG. 13, the ceramic substrate having the surface roughness Ra=0.16 μm had the surface roughness in maximum height Rz of about 1100 nm. Since the wavelength of light emitted from light emitting element (blue LED chip) is about 450 nm, in the ceramic substrate having Ra of 0.16 μm, the surface roughness in maximum height Rz is larger than the wavelength of light from light emitting element. As a result, the influence of scattering is significant. On the other hand, referring to FIG. 15, in the ceramic substrate having the surface roughness of Ra=0.04 μm, the surface roughness in maximum height Rz was about 300 nm, and surface roughness in maximum height Rz is smaller than the wavelength of light emitted from the light emitting element. Therefore, the influence of scattering is almost non-existent, and the surface was apparently a mirror surface.

Next, on the surfaces of these substrates having different Ra, metal reflection film of Ag alloy (alloy of Ag, Pd and Cu: contents of Pd and Cu were each at most 1%) was formed to the thickness of 500 nm, and reflectance of the ceramic substrates was measured. The ceramic substrates subjected to the measurement of reflectance were the four different types of substrates having non-mounting surfaces with surface roughnesses Ra of 0.16 μm, 0.081 μm, 0.04 μm and 0.014 μm, respectively, similar to the ceramic substrates subjected to the measurement of roughness. As to the method of measuring reflectance, light was directed vertically to the mounting surface from the mounting surface side of ceramic substrate, and the amount of returning light was measured. The results are as shown in FIGS. 17 to 20. In FIGS. 17 to 20, the abscissa represents the wavelength (nm) of light and the ordinate represents reflectance (%). Here, note the reflectance of light having the wavelength of 450 nm and 650 nm. The light having the wavelength of 450 nm corresponds to the light emitted from the light emitting elements, and the light having the wavelength of 650 nm corresponds to the light emitted from the fluorescent substance.

Referring to FIGS. 17 to 20, the reflectance of metal reflection film formed on the ceramic substrate with Ra of 0.014 μm was the highest (see FIG. 20), and as Ra becomes larger, the reflectance decreased. The reason may be that the surface irregularities have strong scattering effect. Thus, it was found that in order to attain high reflectance, it is preferable to form a metal reflection film on the ceramic substrate of which surface roughness Ra is at most 0.04 μm.

For confirmation, substrates having metal reflection film of Ag alloy similar to that of Example 3 formed on the ceramic substrates having Ra=0.16 μm and Ra=0.02 μm were additionally prepared, and the surfaces of thus formed metal reflection films were observed by an optical microscope. The result is as shown in FIG. 21. As shown in FIG. 21(a), when Ra=0.16 μm, the surface of metal reflection film had considerable irregularities, reflecting the surface state of ceramic substrate. On the other hand, when Ra=0.02 μm, as shown in FIG. 21 (b), though small spots were observed, generally, the surface was flat and almost a mirror-surface.

As described above, the surface of metal reflection film reflects the surface state of ceramic substrate, and it has strong correlation with the status of the interface of ceramic substrate (non-mounting surface)/metal reflection film. When Ra of ceramic substrate increase, large irregularities generate at the surface of metal reflection film, and because of the large irregularities, the reflectance decreases.

As to the small spots observed at the surface of metal reflection film shown in FIG. 21(b), the ceramic substrate is a sintered body of sapphire ($Al_2O_3$), which is a collected body of small crystals and hence, the substrate has grain boundaries as the boundaries between crystals and small voids. Therefore, at the time of polishing, chipping occurs at the grain boundaries, or voids that were originally contained appear, forming such small spots. Such chipping portions and the like lead to lower reflectance and, therefore, these portions should be reduced as much as possible. For this purpose, at the polishing step, use of diamond having small particle diameter is preferred. Since buffing reduces chipping portions, buffing after polishing is very desirable.

Figure 22:
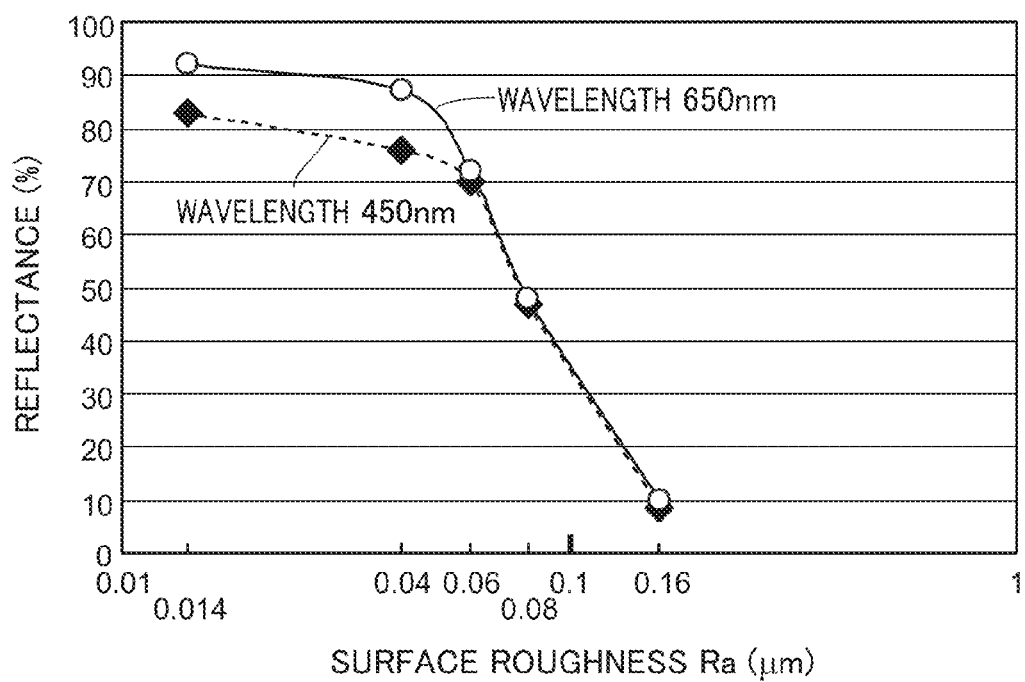
FIG. 22 shows a relation between surface roughness and light reflectance of the non-mounting surface of ceramic substrate having the metal reflection film formed on the non-mounting surface.

Next, using the thus prepared five different ceramic substrates, Ra dependency of light reflectance of light having the wavelength of 450 nm and 650 nm was evaluated. The method of evaluation was the same as described above. The result is as shown in FIG. 22. In FIG. 22, the abscissa represents surface roughness Ra (nm) in exponential expression, and the ordinate represents reflectance (%). Referring to FIG. 22, when the light wavelength is in the long wavelength range (wavelength 650 nm), Ra dependency is higher than in the short wavelength range (wavelength 450 nm), and high reflectance could be attained in the region where Ra was 0.04 μm or smaller. Therefore, it can be seen that the light on the longer wavelength side emitted from the fluorescent substance can be effectively reflected by forming a metal reflection film on the surface of ceramic substrate with Ra of 0.04 μm or smaller. In the wavelength range of 500 nm or longer, reflectance of 80% or more could be attained and the effect was significantly high.

Therefore, in a light emitting device emitting light in the wavelength range of 500 nm or longer, for example, when the fluorescent substance is introduced to the sealing body, or when a light emitting element emitting light having the wavelength of 500 nm or longer is mounted, it is very effective to make the surface roughness Ra of non-mounting surface of ceramic substrate to at most 0.04 μm.

In order to evaluate dependency on surface roughness of non-mounting surface of ceramic substrate (influence of surface roughness on luminous flux), a plurality of light emitting devices having non-mounting surfaces of ceramic substrate with different surface roughnesses were manufactured. Specifically, 6 different types of light emitting devices were manufactured, of which surface roughnesses (arithmetic mean surface roughness) Ra of non-mounting surface were 0.16 μm, 0.081 μm, 0.06 μm, 0.04 μm, 0.014 μm and 0.01 μm, respectively.

Though light emitting devices of Example 4 are similar to Example 1, Example 4 is different from Example 1 in that the thickness of metal reflection film was 500 nm, the thickness of ceramic substrate was 0.5 mm and that the surface roughness of non-mounting surface was varied.

The manufacturing method was similar to that of Example 1. It is noted, however, that in Example 4, different from Example 1, at least one of diamond particle diameter and the polishing time was adjusted at the polishing step to fabricate a plurality of different types of ceramic substrates having different surface Ra. Further, it is noted that the ceramic substrate of Ra=0.16 μm was manufactured without the polishing step.

Figure 23:
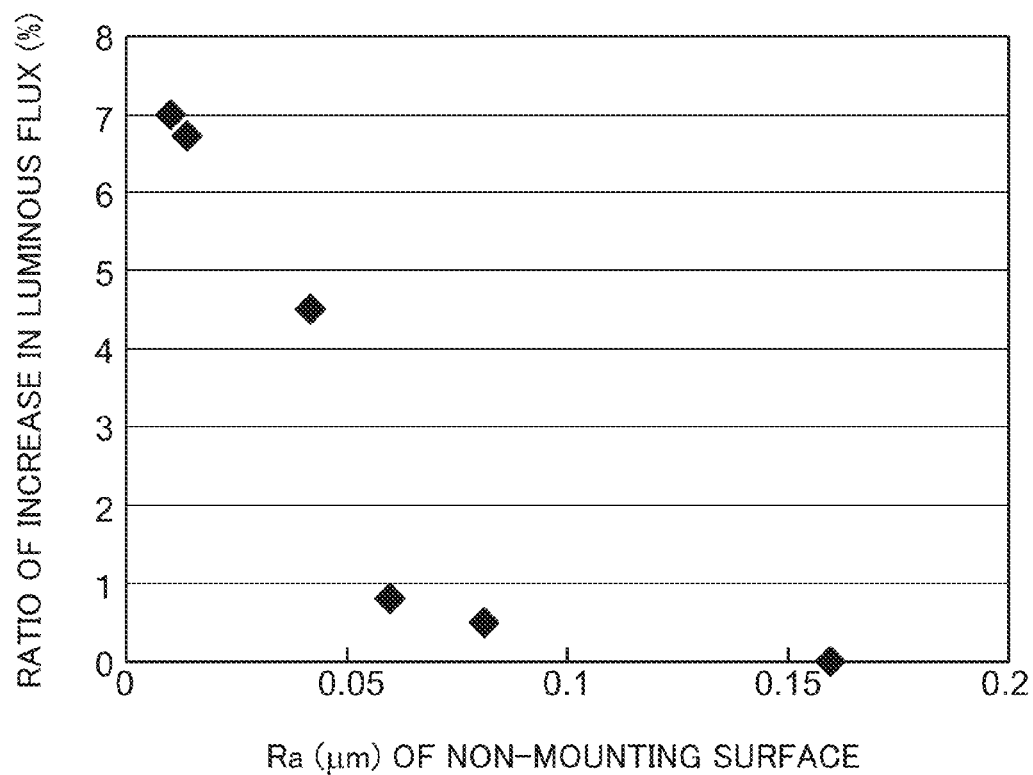
FIG. 23 shows a relation between surface roughness and ratio of increase of luminous flux of the non-mounting surface of ceramic substrate having the metal reflection film formed on the non-mounting surface.

The luminous flux was measured in the similar manner as Example 1. FIG. 23 shows the ratio of increase of luminous flux of each light emitting device with the light emitting device using ceramic substrate of Ra=0.16 μm being the reference. In FIG. 23, the abscissa represents surface roughness Ra (μm) of non-mounting surface of ceramic substrate, and the ordinate represents the ratio of increase (%) of luminous flux of each light emitting device, with Ra=0.16 µm being the reference.

Referring to FIG. 23, the ratio of increase of luminous flux abruptly increases when Ra of non-mounting surface of ceramic substrate was made 0.04 µm or smaller. Thus, it can be seen that forming the metal reflection film with Ra of non-mounting surface of ceramic substrate made 0.04 µm or smaller is very effective.

The possible reason for this is as follows. When Ra of non-mounting surface is very high, the light emitted from light emitting element 60 or the light emitted from the fluorescent substance passes through ceramic substrate 170, reaches the interface between ceramic substrate 170 and metal reflection film 90 and causes multiple reflections, as shown in FIG. 7. By the multiple reflections, the light is absorbed by metal reflection film 90 and the amount of light decreases. On the other hand, if the surface has Ra of 0.04 µm or smaller, the number of multiple reflections at the interface decreases and the optical loss there becomes smaller than when Ra is larger, as shown in FIG. 8. Therefore, when the metal reflection film is formed on the surface having Ra of 0.04 µm or smaller, the ratio of increase of luminous flux increases, as shown in FIG. 23. Therefore, it is more preferred that the non-mounting surface of ceramic substrate has the surface roughness Ra of 0.04 µm or smaller.

The same light emitting device as light emitting device 250 in accordance with the second embodiment was manufactured as Example 5. Specifically, though the light emitting device of Example 5 is similar to Example 1, it is different from Example 1 in that the non-mounting surface of ceramic substrate was not polished and that the thickness of metal reflection film was made to 1 µm. In Example 5, the surface roughness Ra of non-mounting surface of ceramic substrate was about 0.16 µm.

The manufacturing method was similar to that of Example 1. It is noted, however, that Example 5 is different from Example 1 in that the polishing step of polishing the non-mounting surface of ceramic substrate was not conducted and that the metal reflection film was formed to the thickness of 1 µm.

Luminous flux was measured by the same method as Example 1, and the increase of luminous flux was evaluated.

The structure was the same as that of Example 5, except that the metal reflection film was not formed.

The manufacturing method was similar to that of Example 5. It was different, however, from Example 5 in that the step of forming metal reflection film was omitted.

In order to compare luminous flux with that of Example 5, evaluation was done in the similar manner as Example 5.

In the light emitting device of Comparative Example 3, the luminous flux was 2400 lm, and the voltage (the voltage across the light emitting device as a whole) was 38.2 V. In contrast, in the light emitting device of Example 5, the luminous flux was 2436 lm, and the luminous flux was increased by about 1.5% from Comparative Example 1. The voltage was comparable. From the result, it was confirmed that the effect of improving luminous flux by forming the metal reflection film could be attained even when the non-mounting surface was not polished.

The same light emitting device as light emitting device 350 in accordance with the third embodiment was manufactured as Example 6. In Example 6, an Al alloy film was used as the metal reflection film. Except for this point, the structure is the same as that of Example 1.

The manufacturing method was similar to that of Example 1. It was different, however, from Example 1 in that an Al alloy film was formed as the metal reflection film.

The luminous flux was measured in the similar manner as Example 1 and the increase of luminous flux was evaluated.

The structure was the same as Example 6 except that the metal reflection film was not formed.

The manufacturing method was similar to that of Example 6. It was different, however, from Example 6 in that the step of forming metal reflection film was omitted.

In order to compare luminous flux with that of Example 6, evaluation was done in the similar manner as Example 6.

In the comparison between Example 6 and Comparative Example 4, results similar to that of comparison between Example 1 and Comparative Example 1 were obtained. Specifically, the luminous flux was improved by about 3% in Example 6 having the metal reflection film formed of Al alloy film in place of metal reflection film of Ag alloy film, than Comparative Example 4 not having the metal reflection film. Thus, it was confirmed that even when the material of metal reflection film was different, the effect of improving luminous flux could be attained by forming the metal reflection film.

In order to evaluate dependency on the surface roughness of non-mounting surface of ceramic substrate (influence of surface roughness on the luminous flux), a plurality of different types of ceramic substrates having non-mounting surfaces of different surface roughnesses were prepared. The non-mounting surfaces of ceramic substrates had three different surface roughnesses (arithmetic mean surface roughness) Ra of 0.16 µm, 0.04 µm and 0.014 µm. On the non-mounting surface of each ceramic substrate, metal reflection film was formed.

Though ceramic substrates of Example 7 were similar to that of Example 6, Example 7 was different from Example 6 in that the thickness of metal reflection film was 500 nm and that surface roughness of non-mounting surface was varied.

The manufacturing method was similar to that of Example 6. It is noted, however, that in Example 7, different from Example 6, at least one of diamond particle diameter and the polishing time was adjusted at the polishing step to fabricate a plurality of different types of ceramic substrates having different surface Ra. Further, it is noted that the ceramic substrate of Ra=0.16 µm was manufactured without the polishing step.

Figure 24:
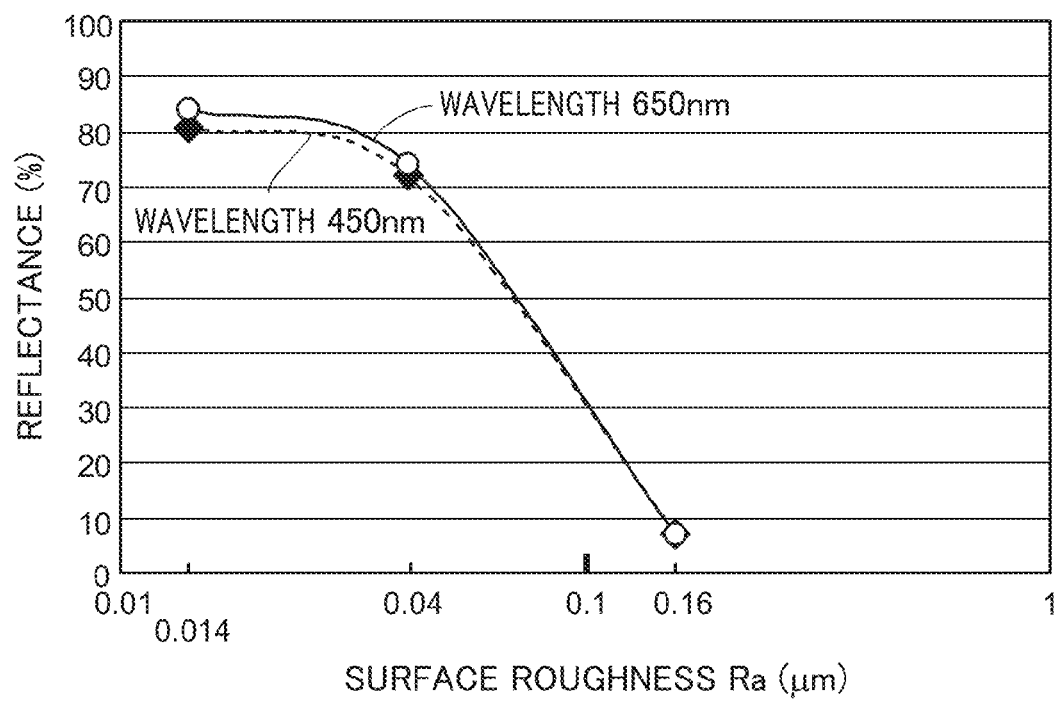
FIG. 24 shows a relation between surface roughness and light reflectance of the non-mounting surface of ceramic substrate having the metal reflection film formed on the non-mounting surface.

Using the thus prepared three different ceramic substrates, Ra dependency of light reflectance of light having the wavelength of 450 nm and 650 nm was evaluated. The method of evaluation was the same as Example 3. The result is as shown in FIG. 24. In FIG. 24, the abscissa represents surface roughness Ra (nm) in exponential expression, and the ordinate represents reflectance (%). Referring to FIG. 24, as compared with Example 3 using an Ag alloy film as the metal reflection film shown in FIG. 22, though the difference between the long wavelength range (wavelength 650 nm) and the short wavelength range (wavelength range 450 nm) is slightly smaller, in the long wavelength range (wavelength 650 nm), Ra dependency is higher than in the short wavelength range (wavelength 450 nm), and high reflectance could be attained in the region where Ra was 0.04 µm or smaller. Even when the metal reflection film was formed of an Al alloy film, similar tendency to when it was formed of Ag alloy film could be confirmed. Thus, it can be seen that the light of longer wavelength side emitted from the fluorescent substance can effectively be reflected by forming a metal reflection film on the surface of ceramic substrate having Ra of 0.04 μm or smaller.

In order to evaluate thickness dependency of ceramic substrate (influence of thickness on the luminous flux), a plurality of different types of light emitting devices having ceramic substrates of different thicknesses were manufactured. Other structures and the manufacturing method of light emitting devices were the same as those of Example 6. The thicknesses of ceramic substrates were the same as those of Example 2. Using these light emitting devices, the luminous flux of each light emitting device was measured, by the similar method as Example 6.

In order to compare the luminous flux with that of Example 8, a plurality of different types of light emitting devices having ceramic substrates of different thicknesses were manufactured. The thicknesses of respective light emitting devices were the same as those of Example 8. Other structures and the manufacturing method of light emitting devices were the same as those of Comparative Example 6. Using these light emitting devices, the luminous flux of each light emitting device was measured, by the similar method as Example 8.

The ratio of increase of luminous flux was also studied in light emitting devices using metal reflection films formed of Al alloy films, with the thickness of ceramic substrates changed variously, and the results were almost the same as the results of comparison between Example 2 and Comparative Example 2. Specifically, in Example 8, there was a tendency that the ratio of increase in luminous flux increased as the thickness of ceramic substrate became smaller. The thickness of ceramic substrate was preferably at most 2 mm, and more preferably, at least 0.2 mm and at most 1.5 mm.

Figure 25:
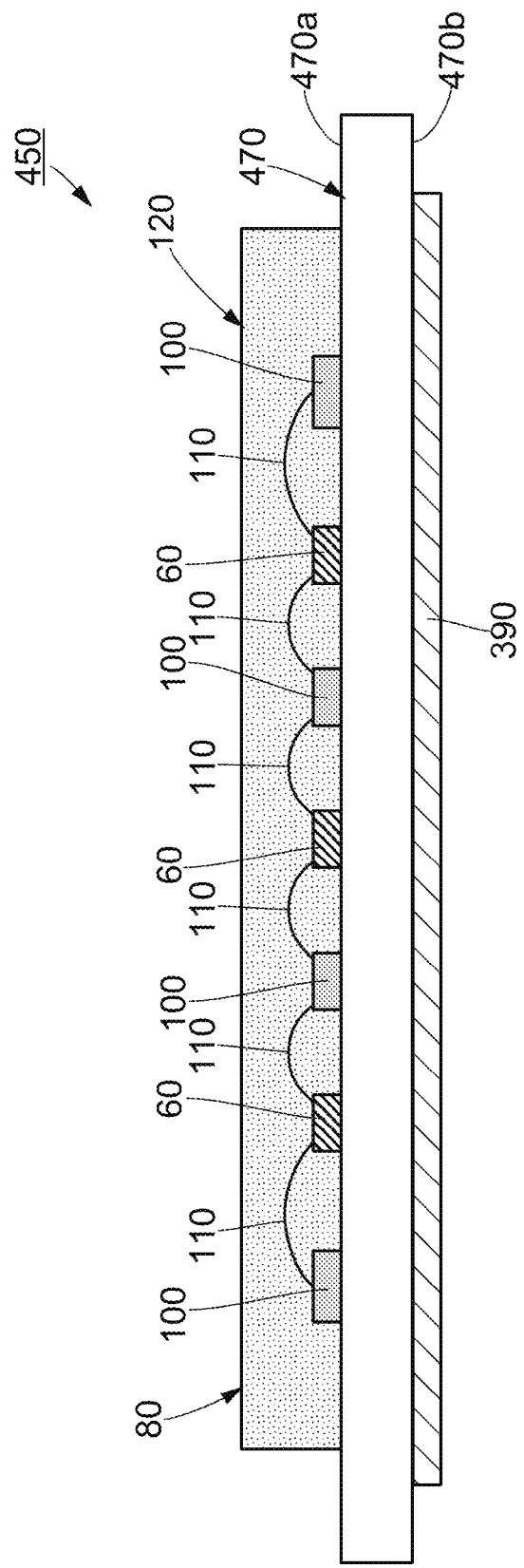
FIG. 25 is a cross-sectional view showing a structure of the light emitting device in accordance with a fourth embodiment of the present invention.

Referring to FIG. 25, a light emitting device 450 in accordance with the present embodiment is formed such that the surface roughness of mounting surface 470a of ceramic substrate 470 is made larger than the surface roughness of non-mounting surface 470b. Specifically, in the present embodiment, the surface roughness Ra of non-mounting surface 470b of ceramic substrate 470 is made 0.04 μm or smaller, while the surface roughness Ra of mounting surface 470a of ceramic substrate 470 is made larger than 0.04 μm. Except for this point, the structure is the same as that of Example 3 described above.

The method of manufacturing light emitting device 450 in accordance with the present embodiment is the same as that of the third embodiment. It is noted, however, that when the surface roughness of mounting surface 470a of ceramic substrate 470 is made larger than the surface roughness of non-mounting surface 470b, mounting surface 470a may be subjected to polishing process, as needed. The polishing process for mounting surface 470a may be the same as that for non-mounting surface 470b.

In the present embodiment, the surface roughness of mounting surface 470a of ceramic substrate 470 is made larger than the surface roughness of non-mounting surface 470b as described above, whereby the efficiency of extracting light reflected by metal reflection film 390 to the outside can be improved. Therefore, the reflectance of ceramic substrate 470 can be improved while heat radiation characteristic can be improved.

Further, when the surface roughness Ra of mounting surface 470a of ceramic substrate 470 is made larger than 0.04 μm, the efficiency of extracting light reflected by metal reflection film 390 to the outside can further be improved.

When the surface roughness Ra of non-mounting surface 470b of ceramic substrate 470 is made equal to or smaller than 0.04 μm, the scattering of light at the interface between non-mounting surface 470b and metal reflection film 390 can easily be prevented, and the reflectance can more effectively be improved.

Other effects of light emitting device 450 in accordance with the present embodiment are the same as those attained by the first to third embodiments.

Next, experiments conducted to confirm the effects of the present embodiment will be described. In the experiment, using ceramic substrates having the non-mounting surfaces of surface roughness Ra equal to or smaller than 0.04 μm (0.015 μm and 0.04 μm), the range of preferable surface roughness of the mounting surface was studied, by varying the surface roughnesses Ra of the mounting surface. The mounting surfaces having four different surface roughnesses Ra, that is, 0.015 μm, 0.04 μm, 0.08 μm and 0.16 μm were used. An Al reflection film (film thickness: 1 μm) was used as the metal reflection film. Each ceramic substrate had the thickness of 0.6 mm. Light emitting devices were manufactured using four different values each (total: 8 different types), and the luminous flux was measured in the similar manner as in Example 1.

The light emitting devices of which mounting surfaces had the surface roughnesses Ra of 0.015 μm and 0.04 μm attained substantially comparable luminous flux. In contrast, the luminous flux attained by the light emitting devices of which mounting surfaces had the surface roughnesses Ra of 0.08 μm and 0.16 μm was increased by about 1% from that of light emitting devices of which mounting surfaces had the surface roughnesses Ra of 0.015 μm and 0.04 μm.

From the results above, it was found that the surface roughness Ra of mounting surface should preferably be larger than 0.04 μm. The reason for this is that when the light reflected by the metal reflection film formed on the non-mounting surface reaches the mounting surface, extraction to the upper side becomes easier when the surface has large irregularities. Thus, it is confirmed that when the metal reflection film is formed on the non-mounting surface, by making surface roughness of mounting surface larger than that of the non-mounting surface, the light extraction efficiency can further be improved.

An illuminating device 1000 in accordance with the present embodiment is an electric bulb type light emitting lamp using LED chips as a light source.

Figure 26:
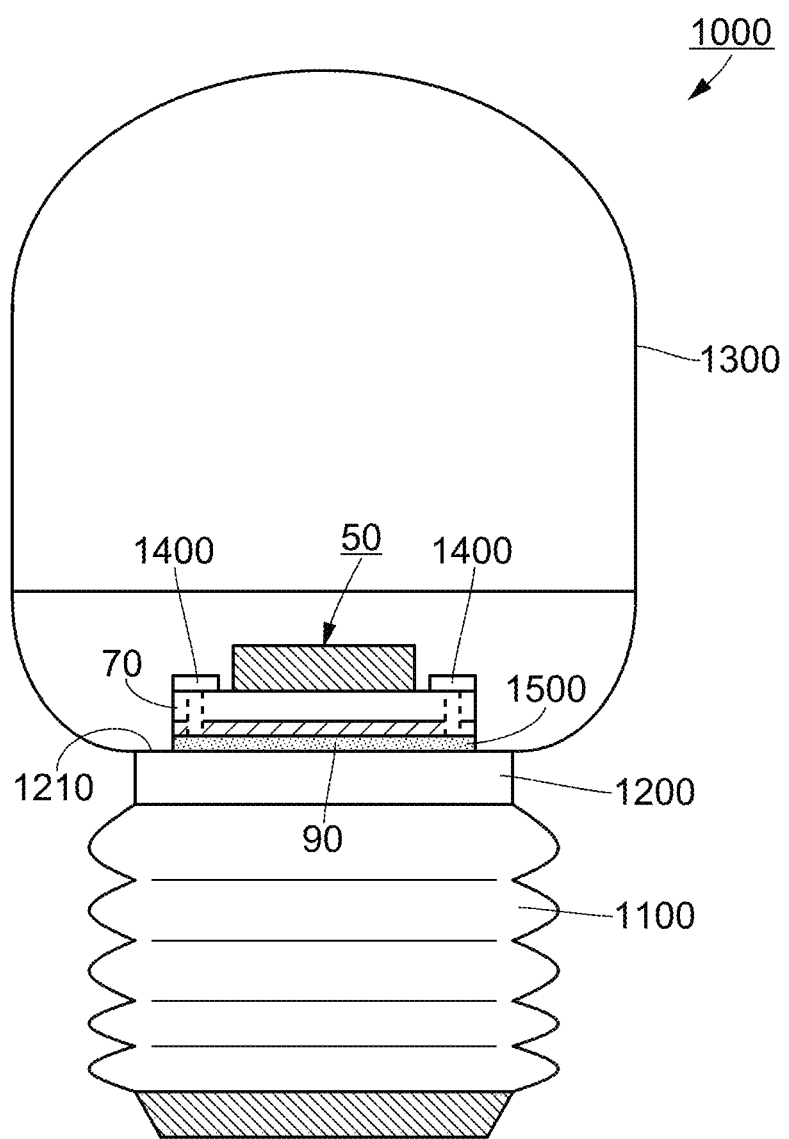
FIG. 26 schematically shows a structure of an illuminating device in accordance with a fifth embodiment of the present invention.

Referring to FIG. 26, illuminating device 1000 includes light emitting device 50 described in the first embodiment above as a light source. Illuminating device 1000 further has a bayonet cap 1100 and an attaching surface 1210 on which light emitting device 50 is attached, and it includes a heat sink 1200 fixed to bayonet cap 1100 and a cover member 1300 provided to cover light emitting device 50 attached to heat sink 1200.

Light emitting device 50 described above is fixed on heat sink 1200 by fixing jig 1400 using fixing holes 72 (see FIG. 1). Fixing jig 1400 is a screw member formed of the same material as ceramic substrate of light emitting device 50. Further, on the attaching surface 1210 of heat sink 1200, a screw hole (not shown) engaged with fixing jig 1400 or screw member is formed.

In the present embodiment, in order to reduce contact thermal resistance, a heat conductor 1500 is inserted between heat sink 1200 and ceramic substrate 70 of light emitting device 50. Heat conductor 1500 is formed of a grease (silicone oil having ceramic fine powder introduced to increase heat conductance), referred to as TIM (Thermal Interfacial Material).

Since light emitting device 50 is used as the light source in the present embodiment, illuminance of illuminating device can be improved.

Further, when light emitting device 50 is fixed, fixing jig 1400 formed of the same material as ceramic substrate 70 of light emitting device 50 is used and, therefore, ceramic substrate 70 and fixing jig 1400 have the same thermal expansion coefficient. Therefore, cracks or chipping of ceramic substrate 70 resulting from warp or the like caused by heat can be prevented. Thus, production yield of light emitting devices 50 and illuminating devices 1000 can be improved.

Further, when fixing jig 1400 of screw member is used for fixing light emitting device 50, sufficient contact between surfaces of ceramic substrate 70 and heat sink 1200 can be attained and, thus, contact thermal resistance can easily be reduced.

Since ceramic substrate is hard, when it is sufficiently fixed on heat sink using the fixing jig, the ceramic substrate may possibly be cracked if the ceramic substrate is thin. This is because stress is applied to the ceramic substrate as the ceramic substrate is warped or the heat sink surface is not sufficiently flat. In such a situation, if metal reflection film 90 is formed on the back surface of ceramic substrate 70 as in the present embodiment, metal reflection film 90 serves to relax stress and prevents damage to ceramic substrate 70. Particularly, regarding cracks, considering alumina ceramic substrate 70, significant effect is attained if the thickness of ceramic substrate 70 is 0.6 mm or smaller. Here, the thickness of metal reflection film 90 is preferably 150 nm or more, to effectively relax stress. On the other hand, if the thickness of ceramic substrate 70 is larger than 0.6 mm, the effect of relaxing stress attained by metal reflection film 90 becomes less significant. In that case, however, cracking is less likely as the strength of ceramic substrate 70 itself increases.

Contact thermal resistance can be decreased by increasing contact pressure. By fixing ceramic substrate 70 of light emitting device 50 to heat sink 1200 using screws, the contact pressure can be increased. Further, since metal reflection film 90 is formed on the non-mounting surface (back surface) of ceramic substrate 70, the contact thermal resistance can be reduced by metal reflection film 90.

Generally, when the ceramic substrate of a light emitting device and a heat sink are brought into contact, surfaces of these two are both not mirror-finished but relatively rough. Therefore, typically, the surfaces of ceramic substrate and the heat sink facing each other have small irregularities, leading to lower heat radiation characteristic.

Figure 27:
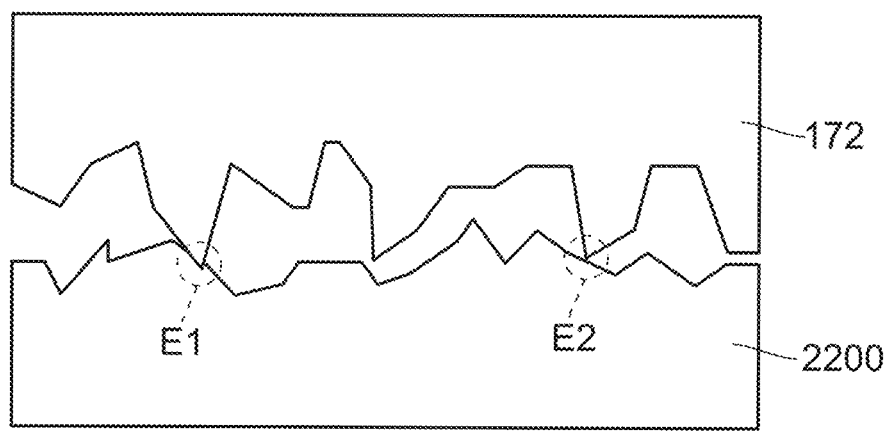
FIG. 27 is a cross-sectional view schematically showing a state at the interface between the ceramic substrate of light emitting device and a heat sink when the light emitting device is mounted on the heat sink.

Referring to FIG. 27, this will be described in greater detail. In a conventional general illuminating device, because of irregularities on the surfaces, the contact between ceramic substrate 172 and heat sink 2200 is not a surface contact but point contacts at the irregularities (see regions E1 and E2 surrounded by dotted lines). Here, gaps form at portions other than the points of contact, and air exists at the interface between ceramic substrate 172 and heat sink 2200. Therefore, contact thermal resistance increases and heat conduction decreases. As a result, efficient heat radiation cannot be attained.

Therefore, it is preferred that a large gap does not exist between the ceramic substrate and the heat sink. Here, in the conventional general illuminating device, heat conductor of TIM is introduced between the ceramic substrate and the heat sink, to fill the gap and thereby to increase contact heat resistance. TIM, however, generally has inferior thermal conductivity to the heat sink and ceramic substrate. Therefore, if a large gap is formed at the interface between ceramic substrate 172 and heat sink 2200 as shown in FIG. 27, a large amount of TIM comes to be introduced to the gap, decreasing thermal conductivity.

Figure 28:
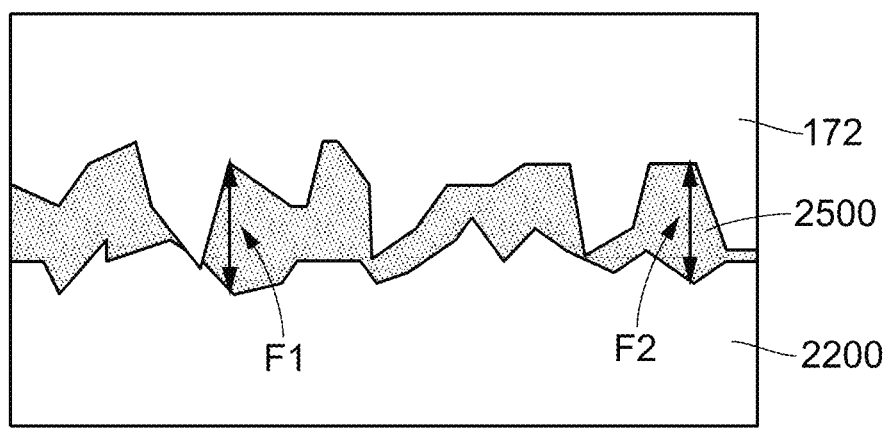
FIG. 28 is a cross-sectional view schematically showing a state at the interface between the ceramic substrate of light emitting device and a heat sink when the light emitting device is mounted on the heat sink.

Referring to FIG. 28, this will be described in greater detail. Consider ceramic substrate 172 of which surface is not flat but has irregularities. Because of such irregularities, many regions (such as regions F1 and F2) are formed where heat conductor 2500 of TIM becomes thick. Since heat resistance at these regions is high, thermal conductivity decreases if such regions generate in large number. This also degrades heat radiation characteristic and hence, it is not preferred from the viewpoint of heat radiation, either.

In the present embodiment, as described above, on the surface (non-mounting surface) facing heat sink 1200 of ceramic substrate 70, metal reflection film 90 is formed. Metal reflection film 90 is softer than ceramic substrate 70 and, therefore, when light emitting device 50 is fixed on heat sink 1200, part of metal reflection film 90 enters the gap by the stress applied by fixing jig 1400, and the volume of gap is reduced. Therefore, even when TIM is used as heat conductor 1500, heat radiation characteristic can be improved by the formation of metal reflection film 90. Therefore, it is preferred also from the viewpoint of heat radiation. Specifically, by forming metal reflection film 90 on the back surface (non-mounting surface) of ceramic substrate 70, contact thermal resistance to heat sink 1200 can be reduced, since metal reflection film 90 has higher thermal conductivity than ceramic substrate 70 and metal reflection film is relatively soft and hence reduces point contact and attains wider contact area than point contact. As a result, heat radiation characteristic can be improved.

Figure 29:
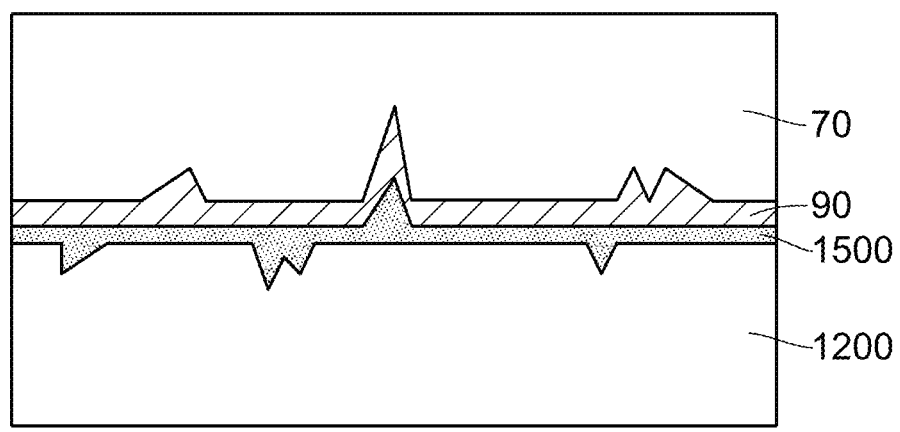
FIG. 29 is a cross-sectional view schematically showing a state at the interface between the ceramic substrate of light emitting device and a heat sink when the light emitting device is mounted on the heat sink.

Referring to FIG. 29, in the present embodiment, flatness of surfaces of ceramic substrate 70 and heat sink 1200 is improved by polishing and the like. Therefore, contact between the ceramic substrate and the heat sink become surface contact, rather than point contact. Consequently, contact thermal resistance can be reduced. Further, by improving surface flatness, the thickness of heat conductor 1500 between ceramic substrate 70 and heat sink 1200 can be reduced.

Specifically, by improving flatness of non-mounting surface of ceramic substrate 70 and by forming metal reflection film 90 on the non-mounting surface as in the present embodiment, small irregularities can be filled by metal reflection film 90 and, hence, the contact area can further be increased. Thus, the contact thermal resistance can effectively be reduced. Further, regarding heat radiation characteristic, by forming metal reflection film 90, contact area can be increased as described above and, therefore, heat radiation characteristic can advantageously be improved. Here, it is preferred that the surface roughness of non-mounting surface of ceramic substrate 70 is at most 0.04 μm.

In the first to fourth embodiments, examples of light emitting devices in which a metal reflection film formed of Ag or its alloy or a metal reflection film formed of Al or its alloy is formed on the ceramic substrate have been described. The present invention, however, is not limited to such embodiments. The metal reflection film formed on the ceramic substrate may be formed of a material other than those mentioned above. In that case, it is preferred that the metal reflection film has the reflectance of 80% or higher.

Though examples in which the metal reflection film is patterned to a prescribed shape have been described in the first to fourth embodiments, the present invention is not limited to such embodiments. The metal reflection film may be formed entirely over the non-mounting surface of ceramic substrate. If the metal reflection film is formed of Ag, Al or an alloy thereof, it is preferred that the metal reflection film is patterned such that it is positioned inner than the edge of ceramic substrate by a prescribed distance, in order to prevent insulation failure caused by migration. When the metal reflection film is patterned, the metal reflection film may have a shape other than that described in the embodiments above.

Though an example in which the line pattern is formed on the ceramic substrate and then the non-mounting surface of ceramic substrate is polished to improve flatness of non-mounting surface has been described in the first to fourth embodiments above, the present invention is not limited to such embodiments. The step of polishing non-mounting surface of ceramic substrate may be conducted before forming the line pattern.

In the embodiments above, the material of ceramic substrate is not specifically limited, and substrates of various materials may be used. A substrate formed of alumina or $SiO_2$ is preferred as the ceramic substrate. Further, as the substrate for mounting the light emitting element, by way of example, a transparent glass substrate may be used. Specifically, the "ceramic substrate" of the present invention encompasses, in its broad meaning, a transparent glass substrate and the like.

Regarding the light emitting element, any light emitting element commonly used in the field of art can be used without any limitation. Examples of such light emitting elements may include semiconductor light emitting elements such as blue LED chips having a gallium nitride compound semiconductor, a ZnO (zinc oxide) compound semiconductor or the like grown on a sapphire substrate, a ZnO (zinc oxide) substrate, a GaN substrate, a Si substrate, a SiC substrate or a spinel, an InGaAlP compound semiconductor LED chip and an AlGaAs compound semiconductor LED chip.

When a blue LED chip having gallium nitride compound semiconductor grown on a sapphire substrate is used as the light emitting element, since the sapphire substrate is transparent, light emitted from an active layer formed in the gallium nitride compound semiconductor passes through the transparent sapphire substrate and enters the ceramic substrate. Therefore, the amount of light reaching the ceramic substrate increases and the effect attained by the metal reflection film formed on the non-mounting surface of ceramic substrate can be enhanced. Therefore, as described in the embodiments above, use of a blue LED chip having gallium nitride compound semiconductor grown on a sapphire substrate is very preferable as the light emitting element.

Even in an AlGaAs compound semiconductor in which the substrate of light emitting element does not pass the light, light emitted from a side surface of light emitting element (LED chip) excites fluorescent substance included in the sealing body, and the light emitted from the excited fluorescent substance enters the ceramic substrate from the mounting surface of ceramic substrate. Therefore, in this case also, the effect of metal reflection film formed on the non-mounting surface of ceramic substrate can be attained.

As described above, when a blue LED chip is used as the light emitting element, it is preferred to form the light emitting device by dispersing fluorescent substance that is excited by the light from the light emitting element and emits yellow light, to realize white light.

Though an example in which a blue LED chip is used as the light emitting element and the light emitted from the blue LED chip has its wavelength converted by the fluorescent substance to realize white light has been described in the first to fourth embodiments above, the present invention is not limited to such embodiments. By way of example, in place of the structure described above, a structure not using any fluorescent substance may be possible. Specifically, the light emitting device may be structured by using an LED chip emitting red light, an LED chip emitting green light and an LED chip emitting blue light as the light emitting elements, to realize white light.

The light emitting element mounted on the light emitting device is not limited to a blue light emitting element, and a light emitting element emitting, for example, ultraviolet light or green light may be used. When a light emitting element emitting ultraviolet light is used, it is preferred to use, for example, a metal reflection film of Al or Al alloy. The reason for this is that reflectance of an Ag reflection film decreases significantly when the wavelength of light is shorter than about 400 nm.

In the embodiment above, the material (sealing material) for forming the sealing body of light emitting device may be any material that transmits light, and it is not specifically limited. Any appropriate material conventionally well-known in the field of art may be used. The sealing body of light emitting device may be adjusted to realize a desired color. For this purpose, by introducing fluorescent substance, it becomes easier to realize white, day-light color, light bulb color or the like. Therefore, from this viewpoint, introduction of fluorescent substance to the sealing body is preferred. By way of example, fluorescent substance such as Ce:YAG (cerium-activated Yttrium-Aluminum-Garnet) fluorescent substance, Eu:BOSE (europium-activated Barium-Strontium-Orthosilicate) fluorescent substance, Eu:SOSE (europium-activated Strontium-Barium-Orthosilicate) fluorescent substance, europium-activated α sialon fluorescent substance and the like may suitably be used, though not limiting. Further, light diffusing agent may be added to the sealing body. Examples of diffusing agent include Sb-based diffusion agent, and agents containing calcium carbonate, silicon oxide and titanium oxide, and any of these may be used.

In the embodiments described above, the sealing body sealing the light emitting elements may be formed as a single layer or two or more layers. When curing resin is used as the sealing material of sealing body, any conventionally known method may be used without any limitation as the method of curing the sealing material, in accordance with the used sealing material. By way of example, it may be thermally set, or a mold resin may be used as the material of sealing body and the sealing material may be cured using a metal mold. The shape of sealing body formed by curing the sealing material is not specifically limited. By way of example, the sealing body may be formed to have a semi-spherical shape protruding upward, so that the sealing body comes to have a function of a lens.

Though an example in which a line pattern formed of a gold film of about 0.07 mm in thickness is formed on the ceramic substrate has been described in the first to fourth embodiments, the present invention is not limited to such embodiments. The thickness and material of line pattern may appropriately be changed. The shape and number of line patterns may also be appropriately changed.

Though an example in which fixing holes are provided in the ceramic substrate of light emitting device has been described in the first to fourth embodiments, the present invention is not limited to such embodiments. The ceramic substrate of light emitting device may not have any fixing hole. If a fixing hole or holes are to be provided in the ceramic substrate, the number, size and forming positions of the fixing holes may appropriately be changed.

Though an example in which a plurality of light emitting elements mounted on a ceramic substrate are connected in series-parallel has been described in the first to fourth embodiments, the present invention is not limited to such embodiments. The connection of light emitting elements may be series connection or parallel connection, other than series-parallel. Further, the number of light emitting elements mounted on the ceramic substrate may appropriately be changed.

Though an example in which a wire of gold line is used as the bonding wire for electrically connecting the light emitting element and the line pattern has been described in the first to fourth embodiments, the present invention is not limited to such embodiments. The bonding wire may not be a gold line. As the bonding wire, an appropriate metal thin wire conventionally widely used in the field of art may be used without any limitation. Examples of such metal thin wires include gold wire, aluminum wire, copper wire and platinum wire. Of these, use of gold wire described in the embodiments is used preferably, since it is not prone to corrosion, has high humidity resistance, high environment resistance, high adhesiveness, high electric conductivity, high thermal conductivity and high coefficient of extension and, in addition, it easily forms a ball.

In the embodiments described above, the light emitting device may be structured to have a reflector for reflecting light. By such a structure, directivity of light can easily be controlled.

In the embodiments described above, the shape and size of light emitting device, the shape and size of ceramic substrate and the shape and size of light emitting element may appropriately be changed.

Further, in the embodiments described above, a protective film formed of $SiO_2$ or the like may be formed on the metal reflection film (on the surface opposite to the ceramic substrate). By such a structure, time-degradation of metal reflection film and diffusion caused by migration can be prevented. As the protection film, an oxide film, a nitride film or an oxynitride film containing any of silicon, aluminum, titanium, tantalum and niobium may be used. The protection film may be a single layer film or multi-layered film of those mentioned above. The above-described effect of the protective film is attained not only when the metal reflection film is formed of Al or Al alloy but also when it is formed of an Ag alloy or when other various metal reflection films are used. The same effect as described above could be attained when an Al alloy containing 0.5% of Ca or an Al alloy containing 1% of Mg was used as the Al alloy.

In the fifth embodiment, an example has been described in which the light emitting device in accordance with the first embodiment is used as the light source of the illuminating device. The present invention, however, is not limited to such an embodiment. The light emitting device in accordance with any of the second to fourth embodiments may be mounted as the light source of the illuminating device. Further, light emitting devices in accordance with the first to fourth embodiments may be appropriately combined and mounted on the illuminating device.

In the fifth embodiment, a bulb-type light emitting lamp is described as an example of the illuminating device. The present invention, however, is not limited to such an embodiment. The illuminating device may be a light emitting lamp of a type other than bulb type. By way of example, the illuminating device may be a straight tube type light emitting lamp, or it may be a circular light emitting lamp. The light emitting device by itself may be used as a light source of other equipments.

In the fifth embodiment, an example in which a heat conductor of TIM is arranged between the ceramic substrate of light emitting device and the heat sink has been described. The present invention, however, is not limited to such an embodiment. The heat conductor may be other than TIM. The heat conductor other than TIM may include, for example, a heat conducting sheet, gel, and high heat-conducting adhesive. Alternatively, the ceramic substrate and the heat sink may be in direct contact with each other, without arranging any heat conductor.

In the fifth embodiment, an example has been described in which a fixing jig formed of the same material as the ceramic substrate is used as the fixing jig for fixing the light emitting device. The present invention, however, is not limited to such an embodiment. A fixing jig formed of a material other than the ceramic substrate may be used. Regarding the fixing jig, one formed of any one selected from aluminum oxide, aluminum nitride, boron nitride, silicon nitride, magnesium oxide, forsterite, steatite, and low-temperature sintered ceramic, or a composite material thereof may suitably be used, in accordance with the material forming the ceramic substrate.

In the fifth embodiment, an example has been described in which the light emitting device is fixed by screw using a fixing jig of screw member. The present invention, however, is not limited to such an embodiment. For instance, the light emitting device may be fixed using an adhesive sheet.

An embodiment realized by appropriately combining the techniques disclosed above is also encompassed by the technical scope of the present invention.

The embodiments as have been described here are mere examples and should not be interpreted as restrictive. The scope of the present invention is determined by each of the claims with appropriate consideration of the written description of the embodiments and embraces modifications within the meaning of, and equivalent to, the languages in the claims.

By the present invention, since reflectance and heat radiation are both improved, a light emitting element, an illuminating device and a method of manufacturing the light emitting element realizing high illuminance can be provided.

REFERENCE SIGNS LIST 50, 250, 350, 450 light emitting device
60 light emitting element
70, 270, 470 ceramic substrate
70a, 470a mounting surface
70b, 270b, 470b non-mounting surface
72 fixing hole
80 sealing body
90, 390 metal reflection film
100 line pattern
102 anode line pattern
104 cathode line pattern
102a, 104a connecting portion
102b, 104b land portion
102c, 104c coupling portion
106, 108 line pattern
110 bonding wire
120 light emitting portion
1000 illuminating device
1100 bayonet cap 1200 heat sink
1210 attaching surface
1300 cover member
1400 fixing jig
1500 heat conductor

The invention claimed is:

1. A light emitting device, comprising:
   a light emitting element;
   a white ceramic substrate having a mounting surface on which said light emitting element is mounted and a non-mounting surface opposite to said mounting surface and on which said light emitting element is not mounted; and
   a metal reflection film, formed on said non-mounting surface, for reflecting light from said light emitting element transmitted through said white ceramic substrate,
   wherein the white ceramic substrate is an alumina sintered body that reflects light by diffused reflection, and
   surface roughness in maximum height (Rz) of the non-mounting surface of the white ceramic substrate is not larger than wavelength of the light emitted from the light emitting element, the non-mounting surface being made of the alumina sintered body.

2. The light emitting device according to claim 1, wherein arithmetic mean surface roughness (Ra) of said non-mounting surface of said white ceramic substrate is at most 0.04 µm.

3. The light emitting device according to claim 1, wherein thickness of said white ceramic substrate is at least 0.2 mm and at most 2.0 mm.

4. The light emitting device according to claim 1, wherein said metal reflection film includes any of a reflection film of Ag, a reflection film of Ag alloy, a reflection film of Al, and a reflection film of Al alloy.

5. The light emitting device according to claim 1, wherein a region for forming said metal reflection film includes a region immediately below said light emitting element.

6. The light emitting device according to claim 1, further comprising a sealing body formed on said mounting surface of said white ceramic substrate and containing a fluorescent substance excited by light from said light emitting element, for sealing said light emitting element.

7. An illuminating device mounting the light emitting device according to claim 1.

8. A light emitting device, comprising:
   a light emitting element;
   a white ceramic substrate having a mounting surface on which said light emitting element is mounted and a non-mounting surface opposite to said mounting surface and on which said light emitting element is not mounted; and
   a metal reflection film, formed on said non-mounting surface, for reflecting light from said light emitting element transmitted through said white ceramic substrate;
   wherein the white ceramic substrate is an alumina sintered body that reflects light by diffused reflection, and
   surface roughness of said mounting surface of said white ceramic substrate is larger than surface roughness of said non-mounting surface, the mounting surface and the non-mounting surface being made of the alumina sintered body.

9. The light emitting device according to claim 8, wherein arithmetic mean surface roughness (Ra) of said mounting surface of said white ceramic substrate is larger than 0.04 µm.

10. The light emitting device according to claim 8, wherein arithmetic mean surface roughness (Ra) of said non-mounting surface of said white ceramic substrate is not larger than 0.04 µm.

* * * * *